(12) United States Patent
Lee et al.

(10) Patent No.: US 11,515,338 B2
(45) Date of Patent: Nov. 29, 2022

(54) DISPLAY DEVICE HAVING LIGHT SHIELDING PATTERN

(71) Applicant: Samsung Display Co., Ltd., Yongin-si (KR)

(72) Inventors: Dong Bum Lee, Suwon-si (KR); Chui Ho Kim, Cheonan-si (KR); Yun Hwan Park, Seoul (KR); In Jun Bae, Seoul (KR); Woo Ri Seo, Seoul (KR); Jin Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 281 days.

(21) Appl. No.: 16/832,796

(22) Filed: Mar. 27, 2020

(65) Prior Publication Data

US 2020/0335524 A1 Oct. 22, 2020

(30) Foreign Application Priority Data

Apr. 16, 2019 (KR) .......................... 10-2019-0044416

(51) Int. Cl.
| | |
|---|---|
| *H01L 27/14* | (2006.01) |
| *H01L 27/12* | (2006.01) |
| *H01L 23/552* | (2006.01) |
| *H01L 31/14* | (2006.01) |
| *G09G 3/3233* | (2016.01) |

(52) U.S. Cl.
CPC .......... *H01L 27/124* (2013.01); *H01L 23/552* (2013.01); *H01L 31/14* (2013.01); *G09G 3/3233* (2013.01); *G09G 2360/14* (2013.01)

(58) Field of Classification Search
CPC ..... H01L 27/124; H01L 23/552; H01L 31/14; G09G 3/3233; G09G 2360/14
USPC .......................................................... 257/72
See application file for complete search history.

(56) References Cited

U.S. PATENT DOCUMENTS

| | | |
|---|---|---|
| 8,207,531 B2 | 6/2012 | Takahashi et al. |
| 8,304,710 B2 | 11/2012 | Takahashi et al. |
| 8,304,981 B2 | 11/2012 | Kim et al. |

(Continued)

FOREIGN PATENT DOCUMENTS

| | | |
|---|---|---|
| KR | 10-2016-0056390 A | 5/2016 |
| KR | 10-2018-0025466 A | 3/2018 |

(Continued)

*Primary Examiner* — Phuc T Dang
(74) *Attorney, Agent, or Firm* — Lewis Roca Rothgerber Christie LLP

(57) ABSTRACT

A display device includes: a substrate; an active layer; a first insulating layer on the active layer; a gate electrode; a second insulating layer on the first conductive layer; a second conductive layer on the second insulating layer; a third insulating layer on the second conductive layer; and a source electrode connected to the source region of the first active pattern through a contact hole passing through the first insulating layer and the second insulating layer, and a drain electrode connected to the drain region, wherein the first active pattern, the gate electrode, the source electrode and the drain electrode constitute a thin film transistor, the display device further comprising at least one light shielding pattern around the thin film transistor, wherein the light shielding pattern includes a side light shielding pattern such that the third conductive layer passes through at least the third insulating layer.

20 Claims, 21 Drawing Sheets

(56) References Cited

U.S. PATENT DOCUMENTS

| | | |
|---|---|---|
| 8,502,230 B2 | 8/2013 | Jeong et al. |
| 8,587,006 B2 | 11/2013 | Kim et al. |
| 2012/0168756 A1 | 7/2012 | Ryu et al. |
| 2017/0102578 A1* | 4/2017 | Shin ................... G02F 1/136209 |
| 2017/0123250 A1* | 5/2017 | Wada ................. H01L 29/78633 |
| 2017/0294460 A1* | 10/2017 | Lee ...................... H01L 27/1251 |
| 2017/0373094 A1* | 12/2017 | Park .................... H01L 27/1255 |
| 2019/0157337 A1* | 5/2019 | Lin ................... H01L 27/14625 |

FOREIGN PATENT DOCUMENTS

| | | |
|---|---|---|
| KR | 10-2018-0057764 A | 5/2018 |
| KR | 10-2018-0088099 A | 8/2018 |

\* cited by examiner

DISPLAY DEVICE HAVING LIGHT SHIELDING PATTERN

CROSS-REFERENCE TO RELATED APPLICATION

This application claims priority to and the benefit of Korean Patent Application No. 10-2019-0044416 filed on Apr. 16, 2019 in the Korean Intellectual Property Office, the contents of which in its entirety are herein incorporated by reference.

BACKGROUND

1. Field

The present disclosure relates to a display device.

2. Description of the Related Art

Display devices are becoming increasingly important with the development of multimedia. Accordingly, various types of display devices such as a liquid crystal display (LCD), an organic light emitting display (OLED) and the like are used. Among the display devices, the organic light emitting display device displays an image using an organic light emitting element that generates light by recombination of electrons and holes. The organic light emitting display device includes a plurality of transistors that provide a driving current to the organic light emitting element.

Meanwhile, in order to realize a bezel-less (or smaller bezel) display device, an infrared-ray (IR) sensor, which is operated in a call mode, may be located in the display area of the display device. However, the characteristics of the transistors of the display device may change due to IR light emitted when the IR sensor is operated.

The above information disclosed in this Background section is only for enhancement of understanding of the background and therefore the information discussed in this Background section does not necessarily constitute prior art.

SUMMARY

Aspects of some example embodiments the present disclosure include a display device capable of preventing or reducing a change in characteristics of a transistor of a display device due to IR light emitted when an IR sensor is operated.

However, aspects of embodiments of the present disclosure are not restricted thereto. The above and other aspects of the present disclosure will become more apparent to one of ordinary skill in the art to which the present disclosure pertains by referencing the detailed description of the present disclosure given below.

According to some example embodiments, it may be possible to provide a display device capable of preventing or reducing a change in characteristics of a transistor of a display device due to IR light emitted when an IR sensor is operated without an additional process.

The characteristics of example embodiments according to the present disclosure are not limited to the above-described characteristics and other characteristics which are not described herein will become more apparent to those skilled in the art from the following description.

According to some example embodiments, a display device includes: a substrate; an active layer on the substrate, the active layer including a first active pattern including a source region, a drain region, and an active region between the source region and the drain region; a first insulating layer on the active layer; a first conductive layer on the first insulating layer and including a gate electrode; a second insulating layer on the first conductive layer; a second conductive layer on the second insulating layer; a third insulating layer on the second conductive layer; and a third conductive layer on the second insulating layer and including a source electrode connected to the source region of the first active pattern through a contact hole passing through the first insulating layer and the second insulating layer, and a drain electrode connected to the drain region of the first active pattern through a contact hole passing through the first insulating layer and the second insulating layer, wherein the first active pattern, the gate electrode, the source electrode and the drain electrode constitute a thin film transistor, the display device further comprising at least one light shielding pattern around the thin film transistor in a plan view, wherein the light shielding pattern includes a side light shielding pattern such that a constituent material of the third conductive layer passes through at least the third insulating layer in a thickness direction.

According to some example embodiments, the side light shielding pattern is formed such that the constituent material of the third conductive layer passes through the third insulating layer.

According to some example embodiments, the side light shielding pattern further passes through the second insulating layer in a thickness direction.

According to some example embodiments, the side light shielding pattern passes through a part of the first insulating layer to terminate inside the first insulating layer.

According to some example embodiments, the side light shielding pattern is formed using a halftone or slit mask.

According to some example embodiments, the thin film transistor is configured to be electrically connected to a driving transistor.

According to some example embodiments, the light shielding pattern is provided plurally, the second conductive layer includes a first data pattern, and the plurality of light shielding patterns include a first light shielding pattern such that a constituent material of the first data pattern passes through the third insulating layer.

According to some example embodiments, the display device further includes a lower light shielding pattern between the substrate and the active layer, wherein a planar size of the lower light shielding pattern is larger than a planar size of the active layer.

According to some example embodiments, the active layer and the lower light shielding pattern are formed using the same mask.

According to some example embodiments, the lower light shielding pattern completely covers the active layer.

According to some example embodiments, a planar shape of the lower light shielding pattern is the same as a planar shape of the active layer.

According to some example embodiments, the lower light shielding pattern includes a metal material.

According to some example embodiments, the substrate includes a display area where a plurality of pixels including the thin film transistor are positioned, and a non-display area around the display area, the display device further comprising: a lower cover panel below the substrate, and an optical sensor surrounded by the lower cover panel in a plan view and below the display area of the substrate.

According to some example embodiments, the display area includes an optical sensor arrangement region where the optical sensor is positioned and an optical sensor non-arrangement region where the optical sensor is not positioned, and wherein the side light shielding pattern is on the optical sensor arrangement region and is not on the optical sensor non-arrangement region.

According to some example embodiments, the display area includes an optical sensor arrangement region where the optical sensor is positioned and an optical sensor non-arrangement region where the optical sensor is not positioned, and wherein the side light shielding pattern is over the optical sensor arrangement region and the optical sensor non-arrangement region.

According to some example embodiments, a display device comprises a display panel; a lower panel sheet below the display panel; and an optical sensor below the display panel and within the lower panel sheet in a plan view, wherein the display panel includes: a display substrate; an active layer on the display substrate, the active layer including a first active pattern including a source region, a drain region, and an active region between the source region and the drain region; a first insulating layer on the active layer; a first conductive layer on the first insulating layer and including a gate electrode; a second insulating layer on the first conductive layer; a second conductive layer on the second insulating layer; a third insulating layer on the second conductive layer; and a third conductive layer on the second insulating layer and including a source electrode connected to the source region of the first active pattern through a contact hole passing through the first insulating layer and the second insulating layer, and a drain electrode connected to the drain region of the first active pattern through a contact hole passing through the first insulating layer and the second insulating layer, wherein the first active pattern, the gate electrode, the source electrode and the drain electrode constitute a first transistor electrically connected to a driving transistor, the display device further comprising a plurality of light shielding patterns around the first transistor in a plan view, wherein the light shielding patterns include a side light shielding pattern such that a constituent material of the third conductive layer passes through at least the third insulating layer in a thickness direction.

According to some example embodiments, the side light shielding pattern is formed such that the constituent material of the third conductive layer passes through the third insulating layer.

According to some example embodiments, the side light shielding pattern further passes through the second insulating layer in a thickness direction.

According to some example embodiments, the side light shielding pattern passes through a part of the first insulating layer to terminate inside the first insulating layer.

According to some example embodiments, the display area includes an optical sensor arrangement region where the optical sensor is positioned and an optical sensor non-arrangement region where the optical sensor is not positioned, and wherein the side light shielding pattern is on the optical sensor arrangement region and is not on the optical sensor non-arrangement region.

BRIEF DESCRIPTION OF THE DRAWINGS

The above and other aspects and characteristics of some example embodiments of the present disclosure will become more apparent by describing in more detail aspects of example embodiments thereof with reference to the attached drawings, in which.

DETAILED DESCRIPTION

Hereinafter, aspects of some example embodiments will be described in more detail with reference to the accompanying drawings. In the following description, an organic light emitting display device is used as an example of a display device.

Figure 1:
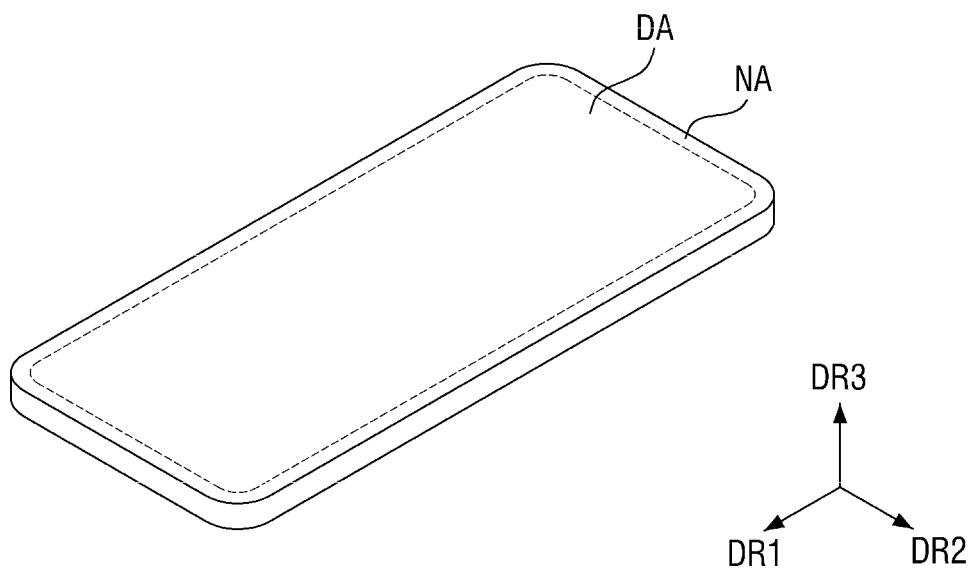
FIG. 1 is a perspective view of a display device according to some example embodiments.
Figure 2:
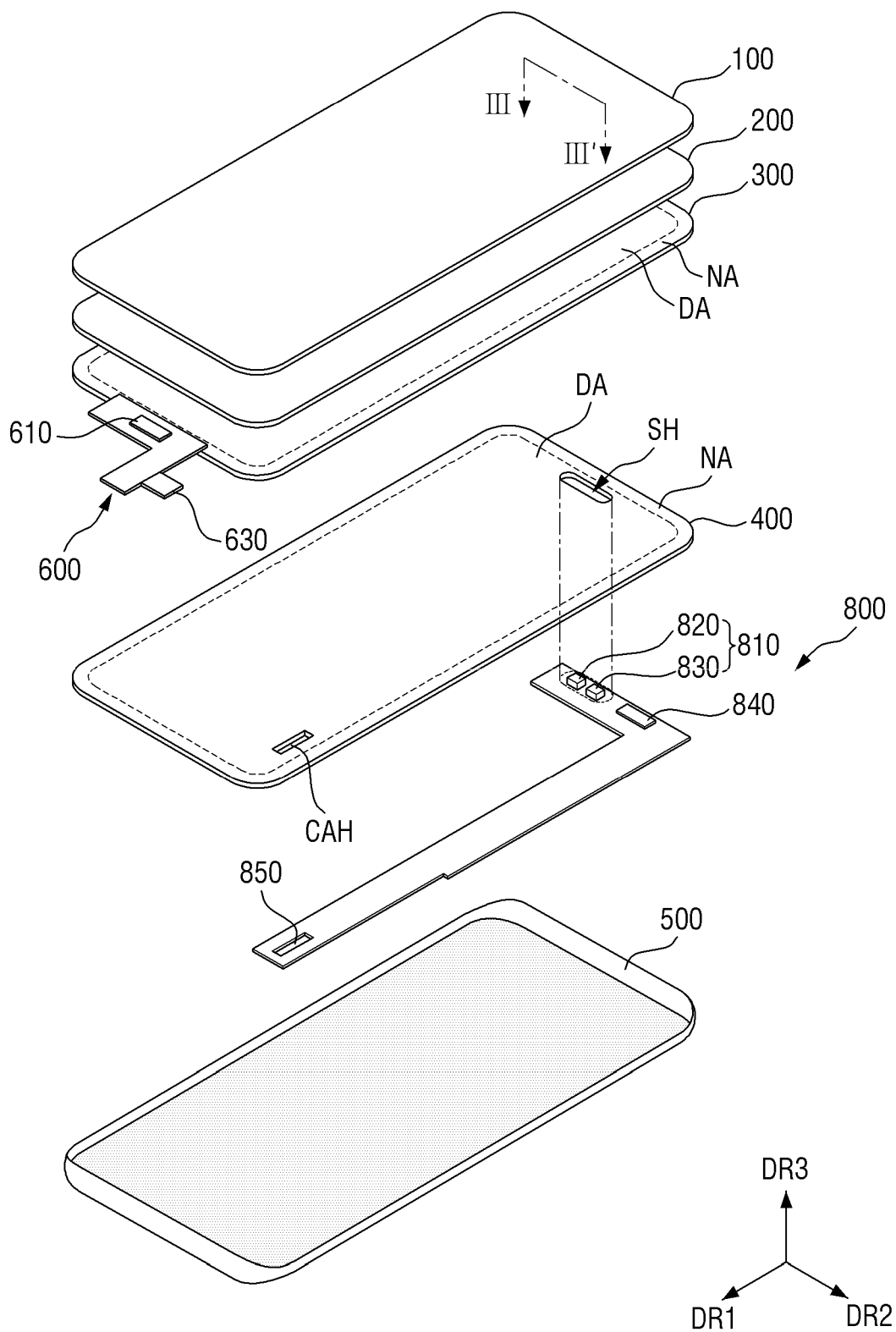
FIG. 2 is an exploded perspective view of a display device according to some example embodiments.
Figure 3:
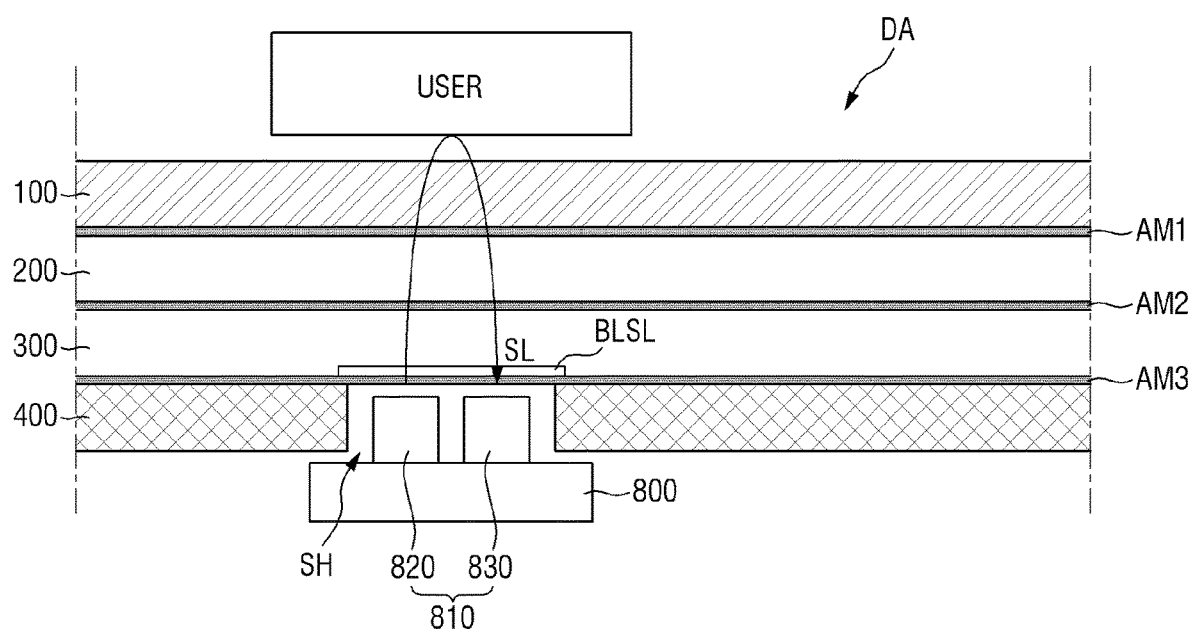
FIG. 3 is a cross-sectional view taken along the line III-III' of FIG. 2.
Figure 4:
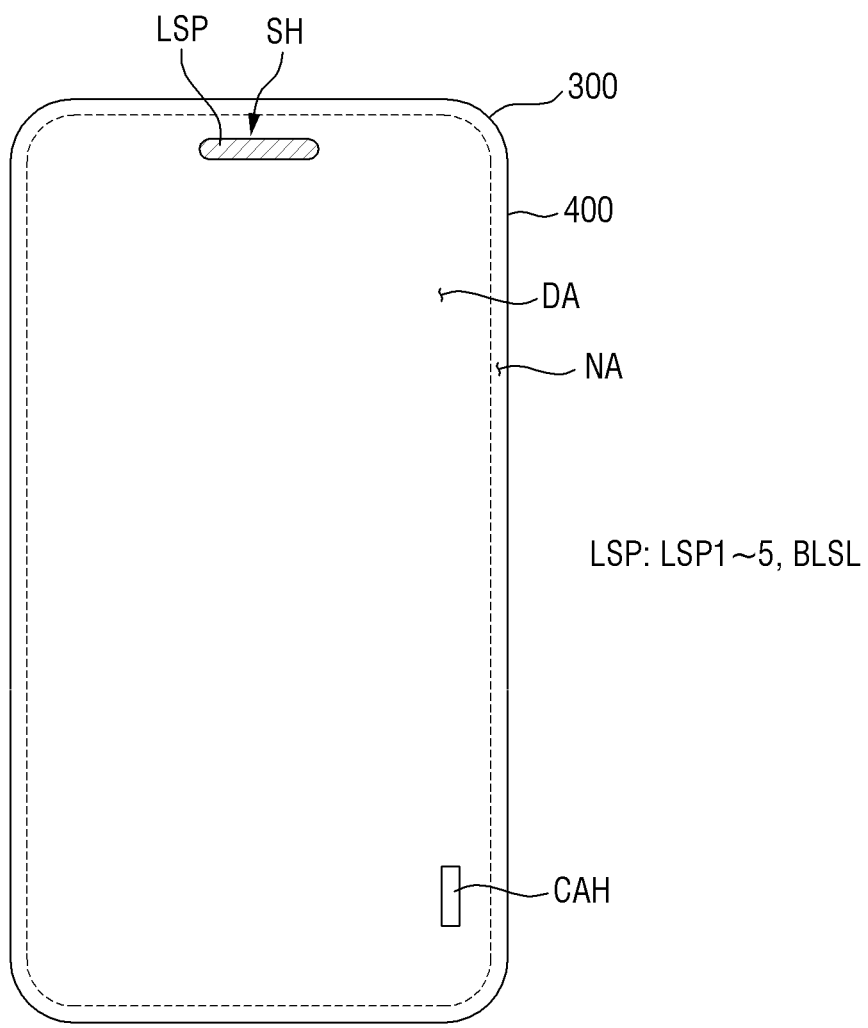
FIG. 4 is a schematic plan layout diagram of a lower panel sheet, a display panel and a light shielding pattern of the display panel according to some example embodiments.

FIG. 1 is a perspective view of a display device according to some example embodiments. FIG. 2 is an exploded perspective view of a display device according to some example embodiments. FIG. 3 is a cross-sectional view taken along the line III-III' of FIG. 2. FIG. 4 is a schematic plan layout diagram of a lower panel sheet, a display panel and a light shielding pattern of the display panel.

The terms "above," "top" and "upper surface" as used herein refer to a direction in which a window 100 is positioned with respect to a display panel 300 to be described later, e.g., one direction of a third direction DR3, and the terms "below," "bottom" and "lower surface" as used herein refer to a direction in which a lower frame 500 is positioned with respect to the display panel 300, e.g., the other direction of the third direction DR3.

Referring to FIGS. 1 to 4, a display device 1 according to some example embodiments includes a window 100, a touch member 200 positioned below the window 100, a display panel 300 located below the touch member 200, a display circuit board 600 attached to the display panel 300, a display driver 610 located on the display circuit board 600, a cover panel 400 located below the display panel 300, a main circuit board 700 located below the cover panel 400 and including a second connector 850 physically connected to a first connector 630 of the display circuit board 600, an optical sensor 810 and a main driver 840 located on the main circuit board 700, and a lower frame 500.

The display device 1 may have a rectangular shape in a plan view. For example, the display device 1 may have a rectangular shape, in a plan view, having long sides in a first direction DR1 and short sides in a second direction DR2, as shown in FIGS. 1 and 2. An edge where the long side in the first direction DR1 and the short side in the second direction DR2 meet may be rounded with a curvature (e.g., a predetermined curvature) or formed with a right angle. The planar shape of the display device 1 is not limited to a rectangular shape, but may be formed in other polygonal shapes such as a circular shape or elliptical shape.

The window 100 may be located above the display panel 300 to cover the upper surface of the display panel 300. Accordingly, the window 100 may function to protect the upper surface of the display panel 300. The window 100 may be made of glass, sapphire, and/or plastic. The window 100 may be rigid or flexible.

The touch member 200 may be located between the window 100 and the display panel 300. The touch member 200 is a device for sensing a user's touch position and may be implemented as a capacitance type such as a self-capacitance type or a mutual capacitance type. The touch member 200 may be formed in a panel form or a film form. Alternatively, the touch member 200 may be formed integrally with the display panel 300. In this case, touch driving electrodes and touch sensing electrodes of the touch member 200 may be formed on a thin film encapsulation layer of the display panel 300. According to some example embodiments, a touch circuit board including a touch driver electrically connected to the touch driving electrodes and the touch sensing electrodes of the touch member 200 may be attached to one side of the touch member 200. The touch circuit board may be a flexible printed circuit board. The touch driver may be formed as an integrated circuit.

The display panel 300 may be, for example, an organic light emitting display panel. In the following embodiments, a case where the organic light emitting display panel is applied as the display panel 300 will be illustrated as an example, but embodiments according to the present disclosure are not limited thereto, and other types of display panels such as a liquid crystal display (LCD) panel, a quantum dot organic light emitting display (QD-OLED) panel, a quantum dot liquid crystal display (QD-LCD) panel, a quantum-nano light emitting display (QNED) panel and a micro LED panel may be applied as the display panel 300.

The display panel 300 includes a display area DA including a plurality of pixels for displaying an image and a non-display area NA located around the display area DA. The display panel 300 includes a display substrate 710 (see FIG. 9), a plurality of transistors 1T to 7T (see FIG. 6) located in the display area DA on the display substrate 710, and an organic light emitting element electrically connected to the plurality of transistors 1T to 7T and including an anode electrode, an organic light emitting layer and a cathode electrode. Each pixel may include the plurality of transistors 1T to 7T and the light emitting element. When a voltage is applied to the anode electrode and the cathode electrode, the holes and electrons move to the organic light emitting layer through the hole transporting layer and the electron transporting layer, respectively, and are combined with each other in the organic light emitting layer to emit light. A specific cross-sectional shape of the display panel 300 will be described in more detail later.

An encapsulation layer is located on a light emitting element layer. The encapsulation layer serves to prevent or reduce instances of oxygen or moisture infiltrating into the light emitting element layer. The encapsulation layer may include at least one inorganic film and at least one organic film.

The display circuit board 600 may be attached to one side of the display panel 300. For example, the display circuit board 600 may be attached to pads provided on one side of the display panel 300 using an anisotropic conductive film. According to some example embodiments, the display circuit board 600 may be attached to one side of the display panel 300 via ultrasonic bonding. The display driver 610 outputs signals and voltages for driving the display panel 300 through the display circuit board 600. The display driver 610 may be formed as an integrated circuit and mounted on the display circuit board 600, but embodiments according to the present disclosure are not limited thereto. For example, the display driver 610 may be attached to one side of the upper surface or the lower surface of the substrate of the display panel 300.

The lower cover panel 400 is located below the display panel 300. The lower cover panel 400 includes at least one functional layer. The functional layer may be a layer that performs a heat dissipation function, an electromagnetic shielding function, a grounding function, a buffering function, a rigidity enhancing function, a supporting function, and/or a digitizing function. The functional layer may be a sheet layer, a film layer, a thin layer, a coating layer, a panel, a plate, or the like. One functional layer may be formed of a single layer, but may also be formed of a plurality of laminated thin films or coating layers. The functional layer may be, for example, a supporting substrate, a heat dissipation layer, an electromagnetic shielding layer, an impact absorbing layer, a digitizer, or the like.

The lower cover panel 400 includes a cable hole CAH through which a first connector 630 of the display circuit board 600 passes in a thickness direction and a sensor hole SH which exposes the optical sensor 810 located on the main circuit board 700. Since the lower cover panel 400 has the sensor hole SH exposing the optical sensor 810, the optical sensor 810 can smoothly proceed toward the display surface.

The main circuit board 700 physically connected to the display circuit board 600 may be located below the lower cover panel 400. The main driver 840 located on the main circuit board 700 may serve to control the display driver 610 described above.

A first optically clear adhesive member AM1 may be located between the window 100 and the touch member 200, a second optically clear adhesive member AM2 may be located between the touch member 200 and the display panel 300, and a third optically clear adhesive member AM3 may be located between the display panel 300 and the lower cover panel 400. The optically clear adhesive members AM1, AM2 and AM3 can couple adjacent members to each other. Each of the optically clear adhesive members AM1, AM2 and AM3 may include at least one of an optically clear adhesive film, an optically clear adhesive tape, or an optically clear resin. Each of the first optically clear adhesive member AM1 and the second optically clear adhesive member AM2 according to some example embodiments may have higher optical transparency than the third optically clear adhesive member AM3. Accordingly, when the display device 1 is a top emission type display device, it is possible to improve the light transmittance of exit light emitted from the display panel 300 to the display surface.

However, without being limited thereto, the optical transparency of the first optically clear adhesive member AM1 and the second optically clear adhesive member AM2 may be the same as the optical transparency of the third optically clear adhesive member AM3.

The optical sensor 810 may include an optical transmitter 820 and an optical receiver 830, as shown in FIG. 3. The optical transmitter 820 is operated in the call mode of the display device 1 to output sensor light LS in an upward direction through the sensor hole SH of the lower cover panel 400. The sensor light LS emitted from the optical transmitter 820 may pass through upper structures (the display panel 300, the touch member 200 and the window 100) and contact a body part of the user. Then, at least a part of the sensor light LS may be reflected from the body part of the user and incident on the optical receiver 830. When light of a reference level (e.g., a predetermined reference level) or higher is incident on the optical receiver 830, the optical sensor 810 stops displaying the screen of the display device 1. Therefore, it is possible to prevent the touch information from being inputted through the display surface of the display device 1 by the user's body part in the call mode. According to some example embodiments, the optical sensor 810 may be, but is not limited to, a facial recognition device, a fingerprint recognition device, an infrared camera, or a single camera using light.

However, because the optical sensor 810 is located to overlap the display area DA and the sensor light LS emitted from the optical sensor 810 passes through the display area DA, an abnormal off current of a plurality of transistors arranged for each pixel may occur due to the sensor light LS. For example, when an off current occurs in third and fourth transistors T3 and T4 (see FIG. 6) to be described in more detail later due to the sensor light LS, the node of the gate voltage of a driving transistor T1 (see FIG. 6) may change and a gradation different from the set reference gradation may appear In order to prevent this phenomenon, the display panel 300 according to some example embodiments may include a light shielding pattern including a lower light shielding layer below a semiconductor layer and a side light shielding pattern at a side of a plurality of semiconductor layers.

Referring to FIG. 4, the display panel 300 may include the above-described light shielding pattern LSP. The light shielding pattern LSP may include a lower light shielding layer BLSL and side light shielding patterns LSP1 to LSP5. The light shielding pattern LSP may be arranged to overlap the optical sensor 810. As shown in FIG. 4, the light shielding pattern LSP may be arranged to overlap the sensor hole SH of the lower panel sheet 400. The planar size of the light shielding pattern LSP may be completely the same as the planar size of the sensor hole SH. Since the light shielding pattern LSP covers the sensor hole SH in a plan view, it is possible to prevent the sensor light SL emitted through the sensor hole SH from entering a semiconductor layer ACT of at least one transistor of the display panel 300 arranged to overlap the sensor hole SH in the thickness direction. The light shielding pattern LSP will be described in more detail later.

Figure 5:
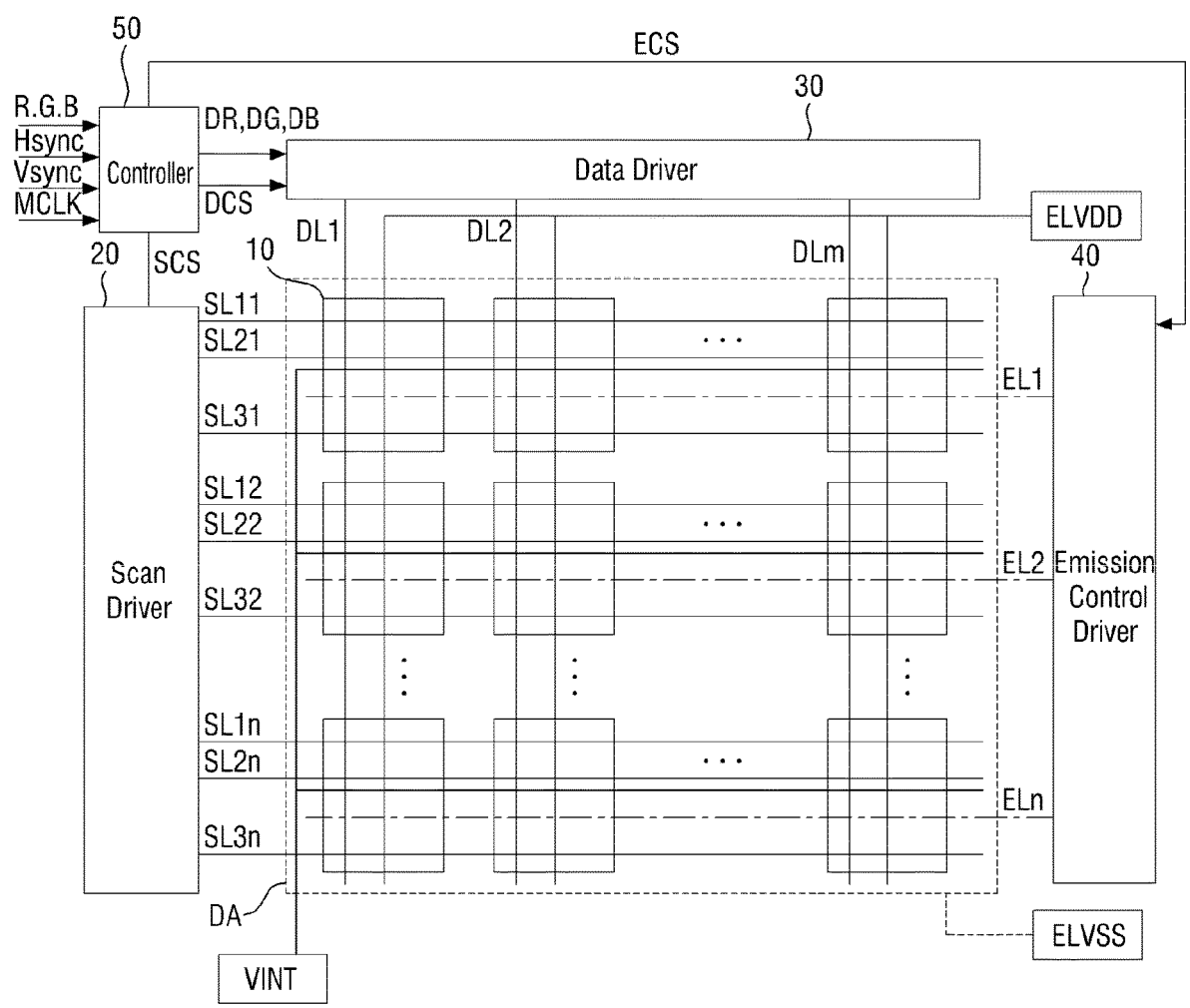
FIG. 5 is a schematic block diagram of a display device according to some example embodiments.

FIG. 5 is a schematic block diagram of a display device according to an embodiment.

Referring to FIG. 5, the display device 1 includes a display area DA including a plurality of pixels 10, a scan driver 20, a data driver 30 (610 in FIG. 2), an emission control driver 40 and a controller 50. The controller 50 functions to control the scan driver 20, the data driver 30 and the emission control driver 40. The controller 50 may be the main driver 840 of FIG. 2.

The display area DA includes a plurality of scan lines SL11 to SL1n, SL21 to SL2n and SL31 to SL3n (n is an integer of 2 or more), a plurality of data lines DL1 to DLm (m is an integer of 2 or more), and a plurality of pixels arranged at the intersections of the plurality of emission control lines EU to ELn and arranged in a matrix form.

The plurality of scan lines SL11 to SL1n, SL21 to SL2n and SL31 to SL3n and the plurality of emission control lines EU to ELn may extend in the row direction and the plurality of data lines DL1 to DLm may extend in the column direction. The row direction and the column direction may be switched to each other. An initialization voltage supply line may be branched for each row to extend in the row direction, and a first source voltage supply line may be branched for each column to extend in the column direction. However, embodiments according to the present disclosure are not limited thereto, and the extending directions of the initialization voltage supply line and the first source voltage supply line may be variously modified.

Three scanning lines SL11, SL21 and SL31, one data line DL1, one emission control line EL1 or EM1, one initialization voltage supply line and one first source voltage supply line may pass through the pixels of the first row and the first column, which are example pixels. The same lines may pass through other pixels.

The scan driver 20 generates and transmits three scan signals to each pixel through the plurality of scan lines SL11 to SL1n, SL21 to SL2n, and SL31 to SL3n. That is, the scan driver 20 sequentially supplies the scan signals to the first scan lines SL11 to SL1n, the second scan lines SL21 to SL2n, or the third scan lines SL31 to SL3n.

The data driver 30 transmits a data signal to each pixel 10 through the plurality of data lines DL1 to DLm. The data signal is supplied to the pixel 10 selected by the second scan signal whenever the second scan signal is supplied to the first scan lines SL11 to SL1n.

The emission control driver 40 generates and transmits an emission control signal to each pixel 10 through a plurality of emission control lines EML1 to EMLn. The emission control signal controls the emission time of the pixel 10. The emission control driver 40 may be omitted depending on the internal structure of the pixel 10 or when the scan driver 20 generates the emission control signal as well as the scan signal.

The controller 50 converts a plurality of image signals R, G and B transmitted from the outside into a plurality of image data signals DR, DG and DB and transmits them to the data driver 30. Further, the controller 50 receives a vertical synchronization signal Vsync, a horizontal synchronization signal Hsync and a clock signal MCLK, and generates control signals for controlling the driving of the scan driver 20, the data driver 30 and the emission control driver 40 and transmits the generated control signals to them. That is, the controller 50 generates and transmits a scan driving control signal SCS for controlling the scan driver 20, a data driving control signal DCS for controlling the data driver 30, and an emission driving control signal ECS for controlling the emission control driver 40, respectively.

Each of the plurality of pixels 10 is supplied with a first source voltage ELVDD and a second source voltage ELVSS. The first source voltage ELVDD may be a high level voltage (e.g., a predetermined high level voltage), and the second source voltage ELVSS may be a voltage lower than the first source voltage ELVDD.

Each of the plurality of pixels 10 emits light of a luminance (e.g., a predetermined luminance) by a driving current supplied to a light emitting element according to a data signal transmitted through a plurality of data lines DL1 to DLm.

The first source voltage ELVDD, the second source voltage ELVSS, the initialization voltage VINT and the like may be supplied from an external voltage source.

Figure 6:
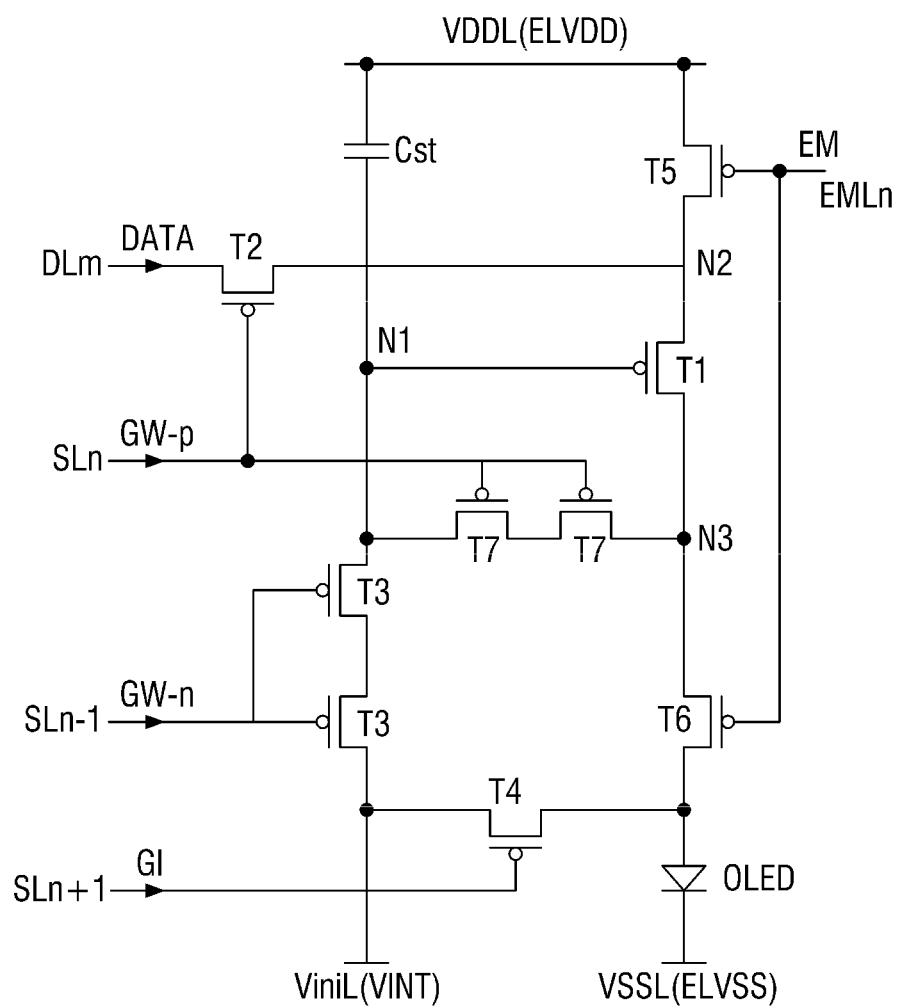
FIG. 6 is an equivalent circuit diagram of one pixel of a display device according to some example embodiments.

FIG. 6 is an equivalent circuit diagram of one pixel of a display device according to an embodiment.

Referring to FIG. 6, a circuit of one pixel of the display device 1 includes an organic light emitting diode OLED, a plurality of transistors T1 to T7 and a storage capacitor Cst. A data signal DATA, a first scan signal Gw-p, a second scan signal Gw-n, a third scan signal GI, an emission control signal EM, the first source voltage ELVDD, the second source voltage ELVSS, and the initialization voltage VINT are applied to a circuit of one pixel.

The organic light emitting diode OLED includes an anode electrode and a cathode electrode. The storage capacitor Cst includes a first electrode and a second electrode.

The plurality of transistors may include first to seventh transistors T1 to T7. The transistors T1 to T7 include a gate electrode, a first electrode and a second electrode. One of the first and second electrodes of each of the transistors T1 to T7 is a source electrode and the other electrode is a drain electrode.

Each of the transistors T1 to T7 may be a thin film transistor.

Hereinafter, each component will be described in more detail.

The gate electrode of the first transistor T1 is connected to the first electrode of the storage capacitor Cst. The first electrode of the first transistor T1 is connected to a first source voltage supply line ELVDDL for applying the first source voltage ELVDD via the fifth transistor T5. The second electrode of the first transistor T1 is connected to the anode electrode of the organic light emitting diode OLED via the sixth transistor T6. The first transistor T1 receives the data signal DATA according to the switching operation of the third transistor T2 and supplies a driving current Id to the organic light emitting diode OLED.

The gate electrode of the second transistor T2 is connected to the second scan line SLn for applying the second scan signal Gw-p. The first electrode of the second transistor T2 is connected to the data line DLm. The second electrode of the second transistor T2 is connected to the first electrode of the first transistor T1 and is connected to the first source voltage supply line VDDL via the fifth transistor T5. The second transistor T2 is turned on according to the first scan signal Gw-p and performs a switching operation of transmitting the data signal DATA to the first electrode of the first transistor T1.

The gate electrode of the third transistor T3 is connected to the first scan line SLn-1 for applying the first scan signal Gw-n. The first electrode of the third transistor T3 is connected to the first electrode of the storage capacitor Cst and the gate electrode of the first transistor T1, and the second electrode of the third transistor T3 is connected to an initialization voltage line ViniL for applying the initialization voltage VINT.

The gate electrode of the fourth transistor T4 is connected to a terminal of the third scan signal GI. The second electrode of the fourth transistor T4 is connected to the initialization voltage supply line ViniL and the second electrode of the third transistor T3. The first electrode of the fourth transistor T4 is connected to the anode electrode of the organic light emitting diode OLED and the second electrode of the sixth transistor T6.

The gate electrode of the fifth transistor T5 is connected to the emission control line EMLn for applying the emission control signal EM. The first electrode of the fifth transistor T5 is connected to a terminal of the first source voltage ELVDD. The second electrode of the fifth transistor T5 is connected to the first electrode of the first transistor T1 and the second electrode of the second transistor T2.

The gate electrode of the sixth transistor T6 is connected to the emission control line EMLn for applying the emission control signal EM. The first electrode of the sixth transistor T6 is connected to the second electrode of the first transistor T1. The second electrode of the sixth transistor T6 is connected to the anode electrode of the organic light emitting diode OLED.

The fifth transistor T5 and the sixth transistor T6 are simultaneously turned on in response to the emission control signal EM so that the driving current Id flows through the organic light emitting diode OLED.

The gate electrode of the seventh transistor T7 is connected to the second scan line SLn for applying the second scan signal Gw-p. The first electrode of the seventh transistor T7 is connected to the first electrode of the sixth transistor T6 and the second electrode of the first transistor T1. The second electrode of the seventh transistor T7 is connected to the first electrode of the third transistor T3, the first electrode of the storage capacitor Cst and the gate electrode of the first transistor T1. Meanwhile, as shown in FIG. 5, the third transistor T3 and the seventh transistor T7 may be formed of a dual transistor, but embodiments according to the present disclosure are not limited thereto.

The second electrode of the storage capacitor Cst is connected to the first source voltage supply line VDDL. The first electrode of the storage capacitor Cst is connected to both the gate electrode of the first transistor T1 and the second electrode of the third transistor T3. The cathode electrode of the organic light emitting diode OLED is connected to a supply line VSSL of the second source voltage ELVSS. The organic light emitting diode OLED receives the driving current Id from the first transistor T1 and emits light to display an image.

Hereinafter, the plane arrangement and the cross-sectional structure of the above-described pixels will be described in more detail.

Figure 7:
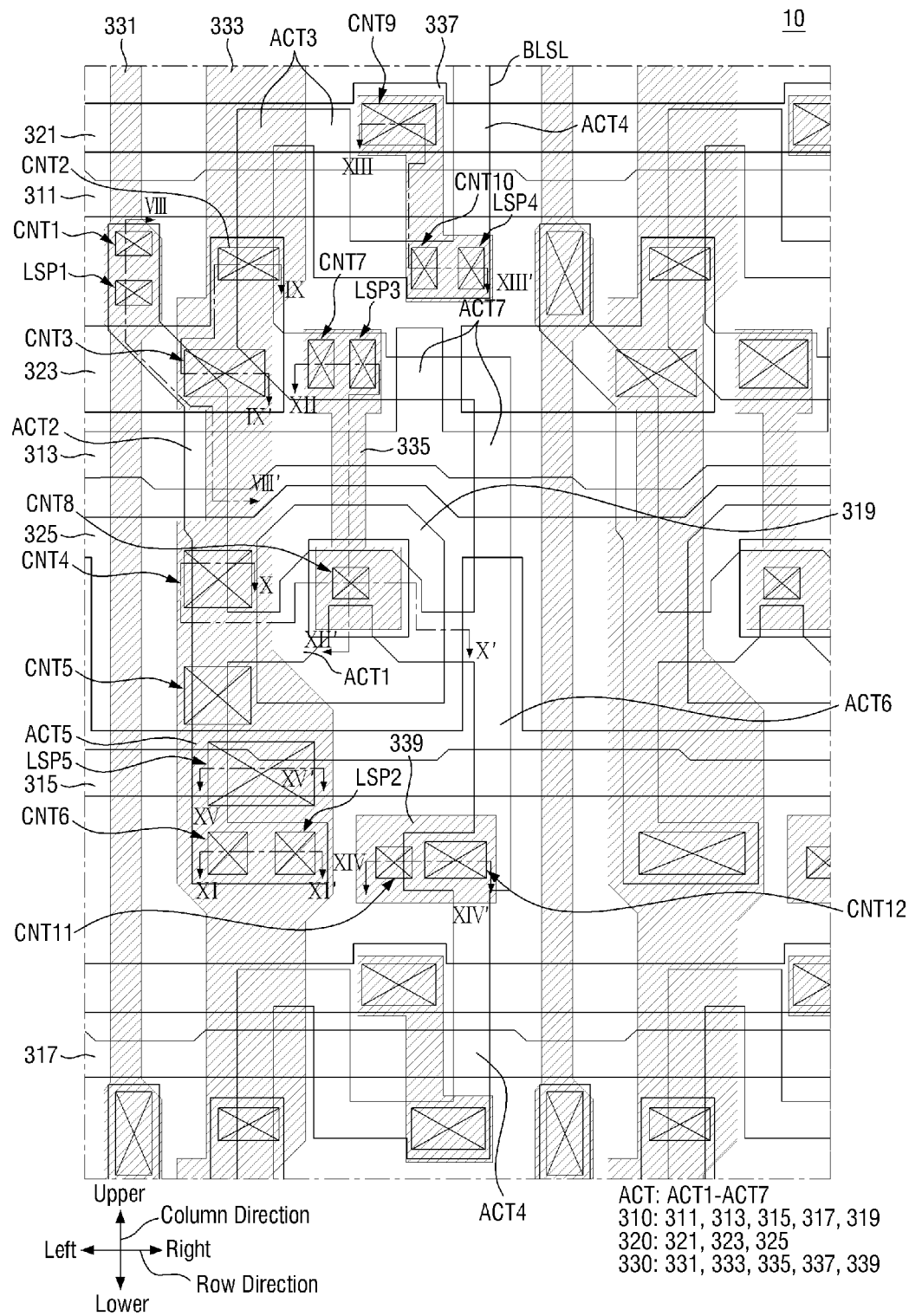
FIG. 7 is a layout diagram of one pixel of a display device according to some example embodiments.
Figure 8:
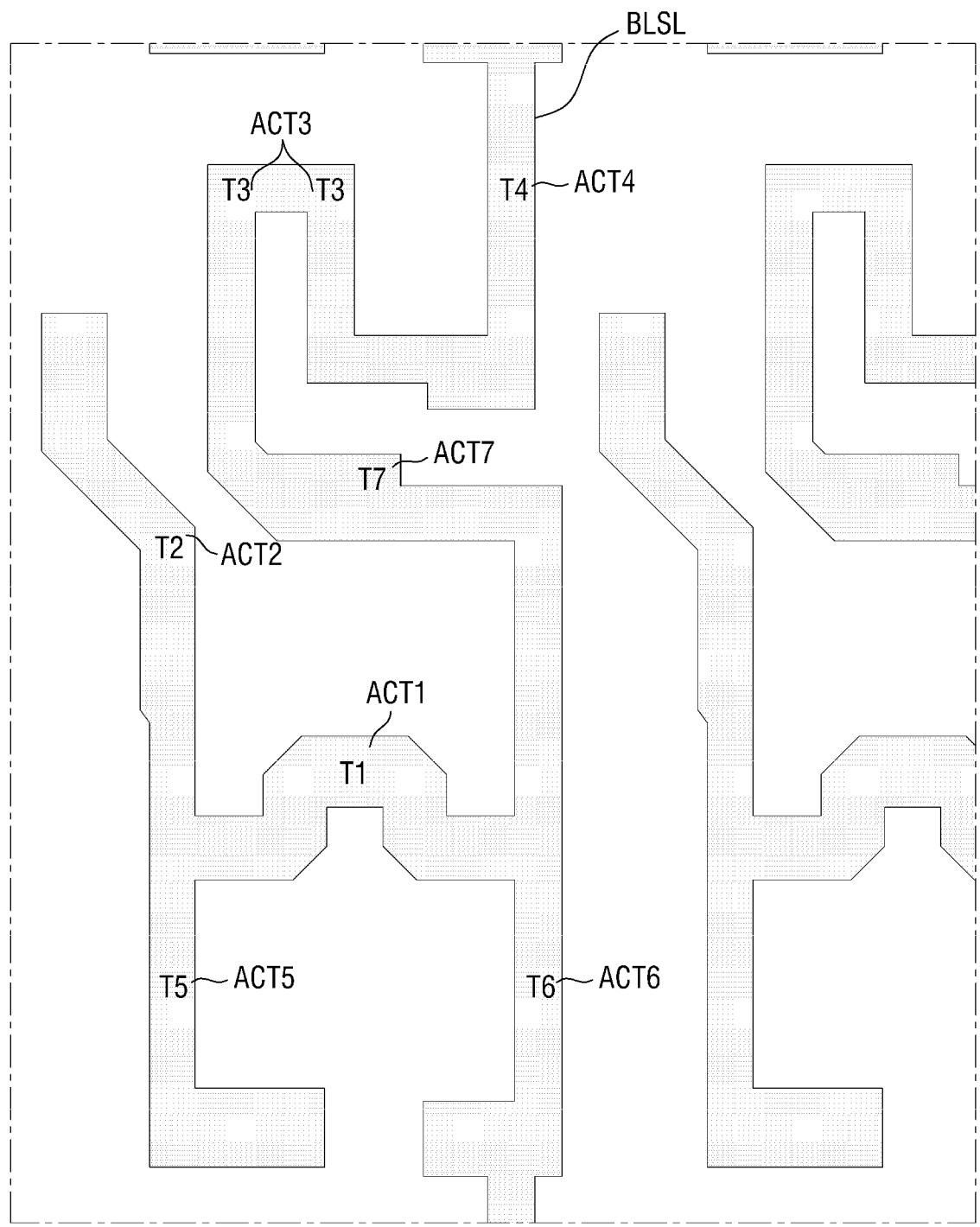
FIG. 8 is a layout diagram of the semiconductor layer and the lower light shielding layer of FIG. 7.
Figure 9:
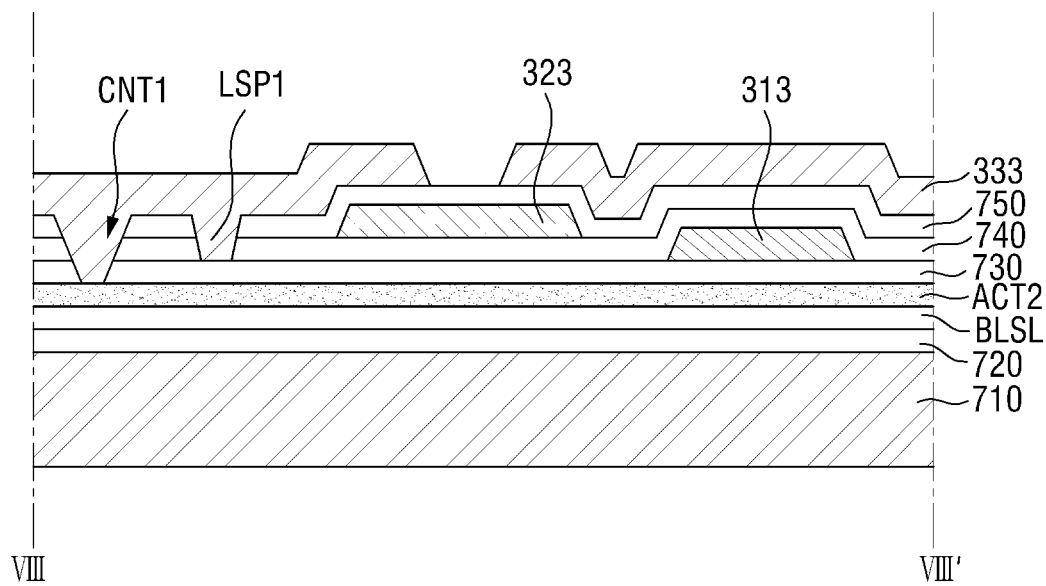
FIG. 9 is a cross-sectional view taken along the line VIII-VIII' of FIG. 7.
Figure 10:
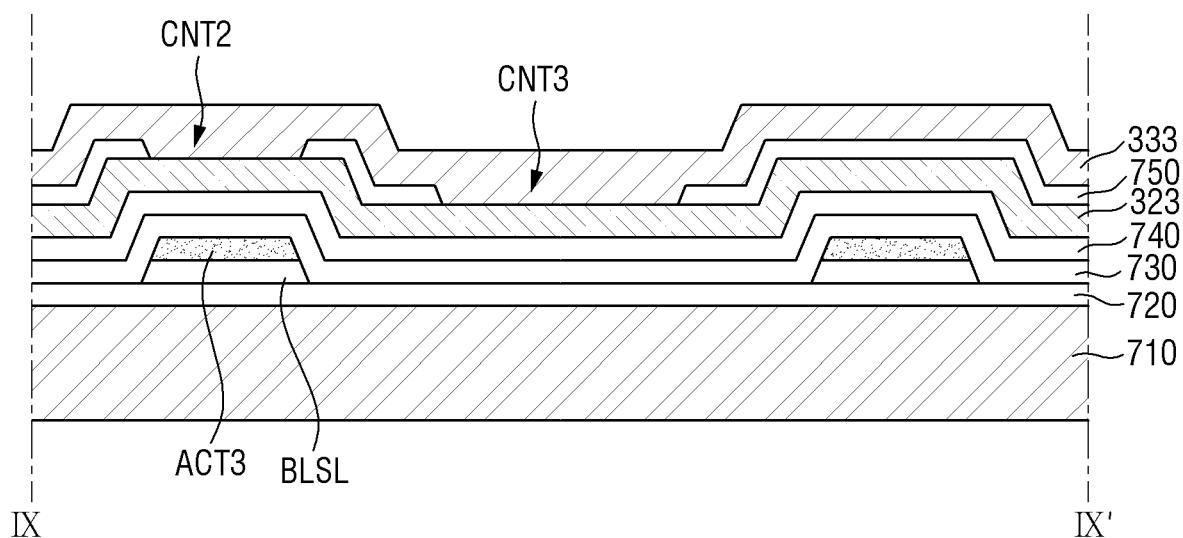
FIG. 10 is a cross-sectional view taken along the line IX-IX' of FIG. 7.
Figure 11:
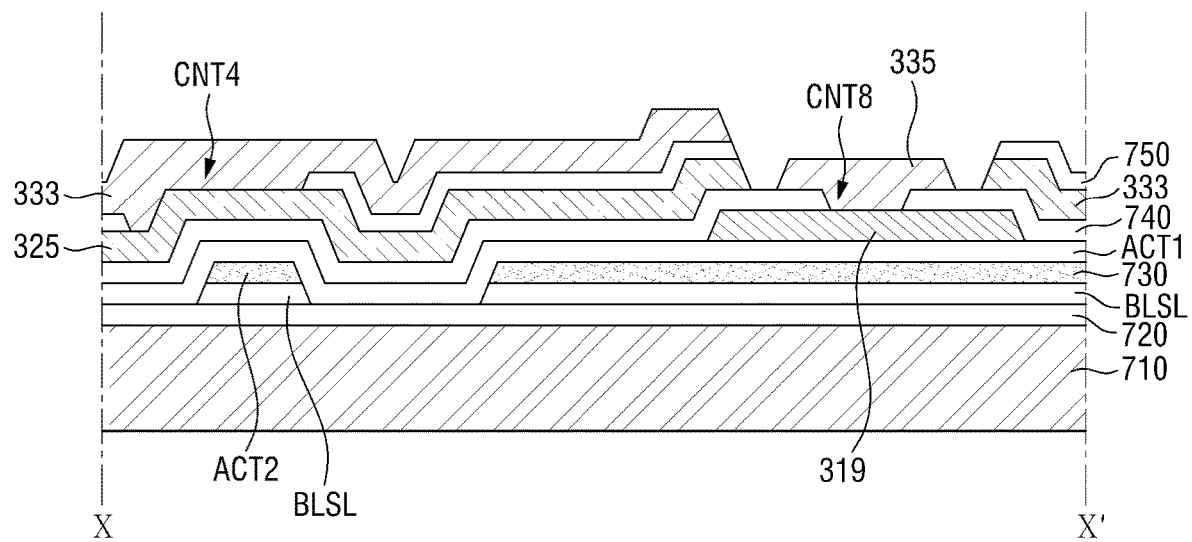
FIG. 11 is a cross-sectional view taken along the line X-X' of FIG. 7.
Figure 12:
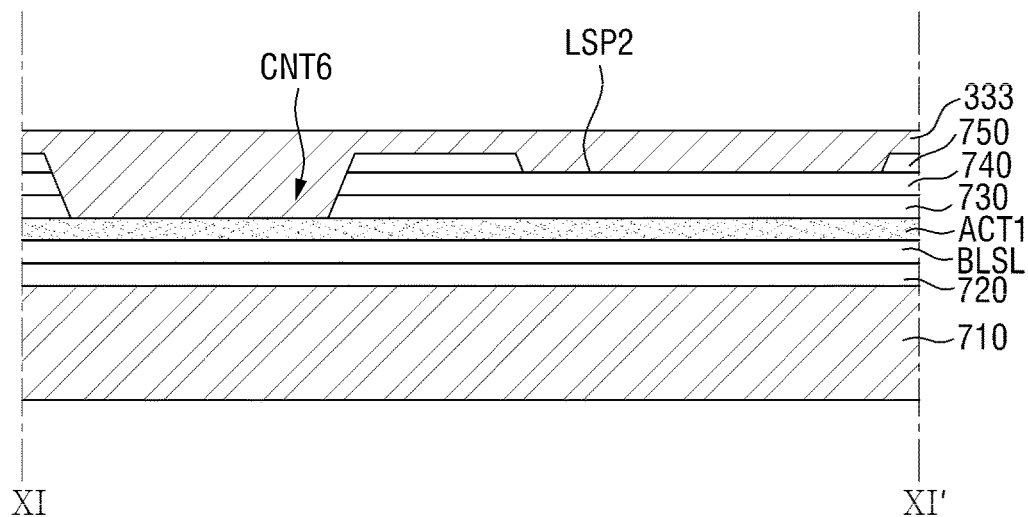
FIG. 12 is a cross-sectional view taken along the line XI-XI' of FIG. 7.
Figure 13:
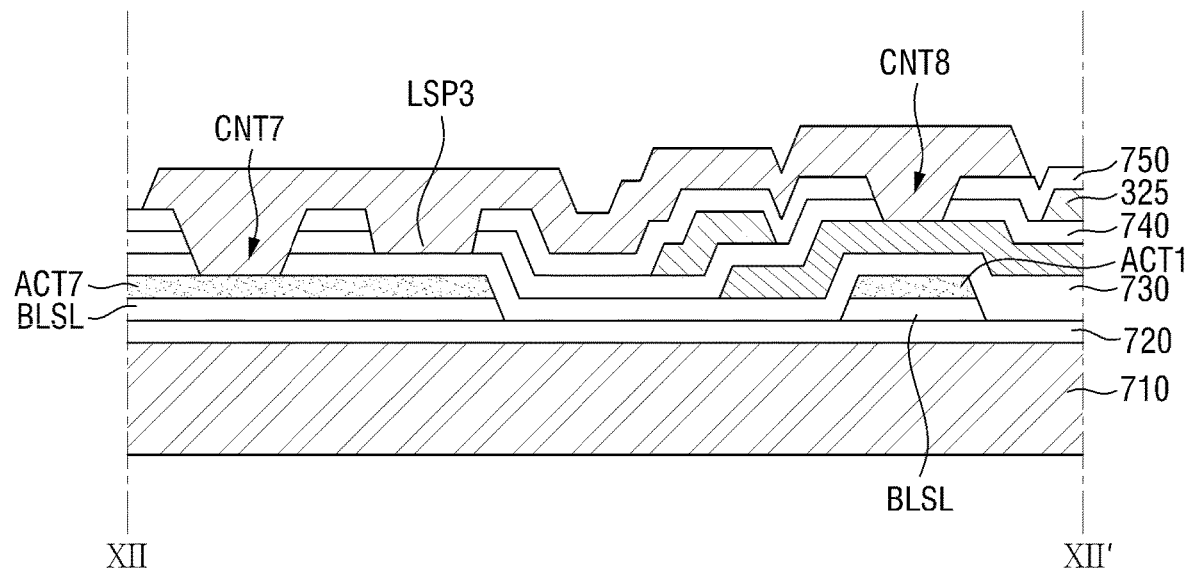
FIG. 13 is a cross-sectional view taken along the line XII-XII' of FIG. 7.
Figure 14:
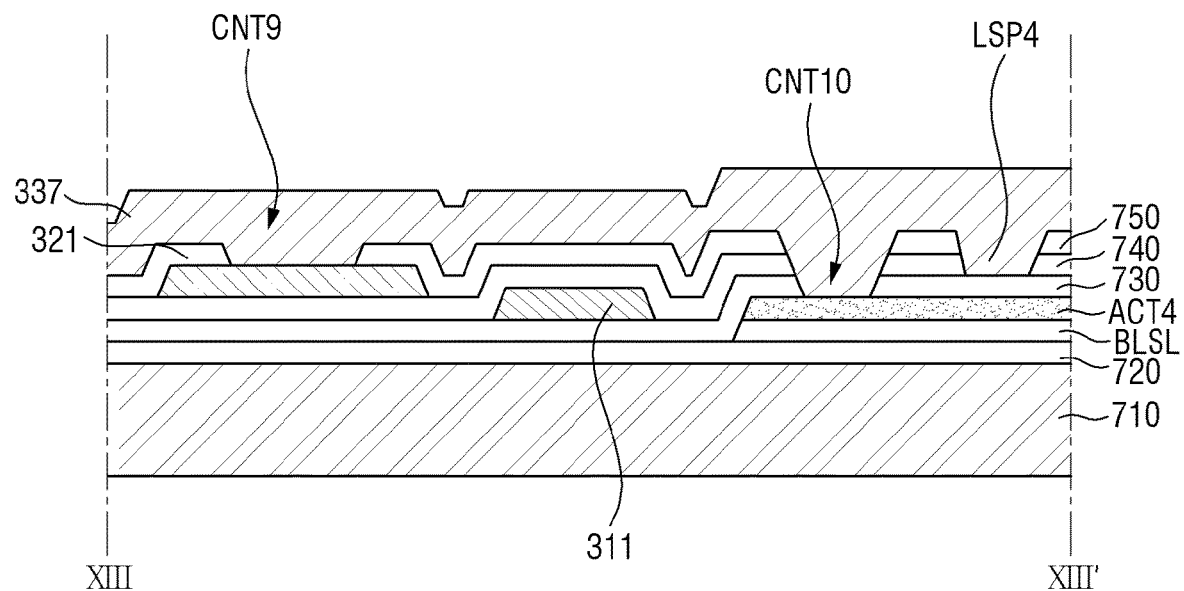
FIG. 14 is a cross-sectional view taken along the line XIII-XIII' of FIG. 7.
Figure 15:
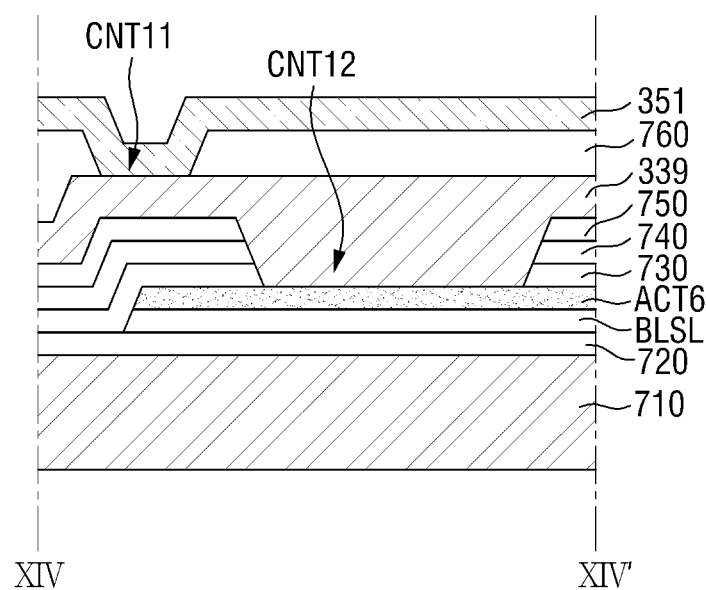
FIG. 15 is a cross-sectional view taken along the line XIV-XIV' of FIG. 7.
Figure 16:
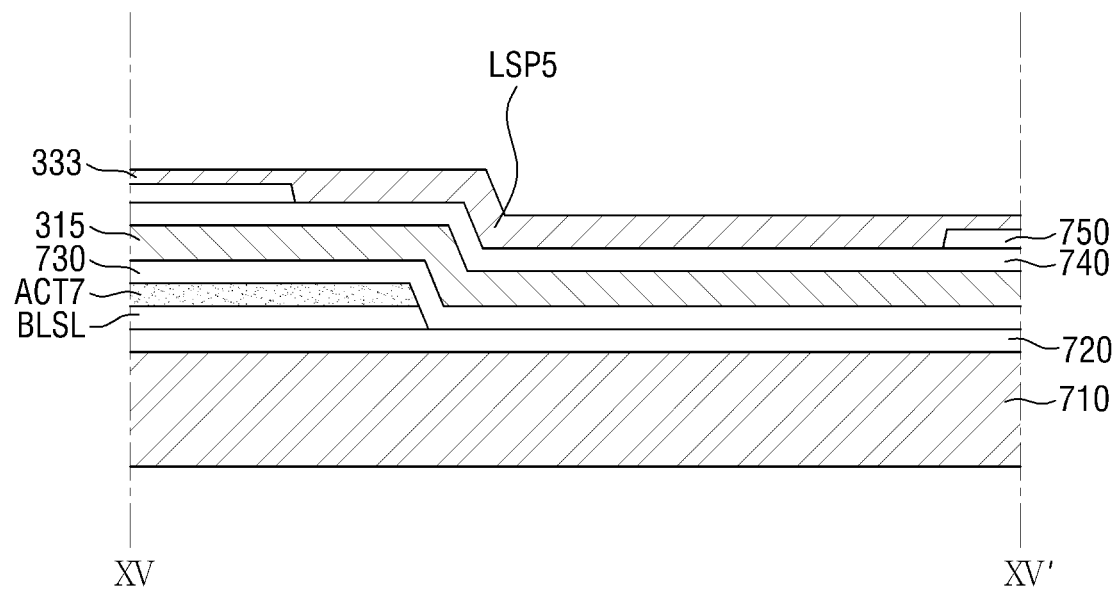
FIG. 16 is a cross-sectional view taken along the line XV-XV' of FIG. 7.

FIG. 7 is a layout diagram of one pixel of a display device according to an embodiment. FIG. 8 is a layout diagram of the semiconductor layer and the lower light shielding layer of FIG. 7. FIG. 9 is a cross-sectional view taken along the line VIII-VIII' of FIG. 7. FIG. 10 is a cross-sectional view taken along the line IX-IX' of FIG. 7. FIG. 11 is a cross-sectional view taken along the line X-X' of FIG. 7. FIG. 12 is a cross-sectional view taken along the line XI-XI' of FIG. 7. FIG. 13 is a cross-sectional view taken along the line XII-XII' of FIG. 7. FIG. 14 is a cross-sectional view taken along the line XIII-XIII' of FIG. 7. FIG. 15 is a cross-sectional view taken along the line XIV-XIV' of FIG. 7. FIG. 16 is a cross-sectional view taken along the line XV-XV' of FIG. 7.

In the following embodiments, some of the elements are denoted by new reference numerals to facilitate a description of the arrangement and coupling relationship between the elements even though they are substantially the same as the elements mentioned with reference to FIGS. 1 to 6.

Further, FIG. 7 and cross-sectional views thereof are a layout diagram of a pixel of the display panel 300 arranged to overlap the sensor hole SH of the lower panel sheet 400 in the thickness direction and cross-sectional views thereof.

Referring to FIGS. 7 to 16, as described above, the pixel includes a plurality of transistors T1 to T7, a storage capacitor Cst (see FIG. 2), and an organic light emitting diode OLED (see FIG. 2). Further, it may include a plurality of side light shielding patterns LSP1 to LSP5 arranged around the plurality of transistors T1 to T7 of each pixel. Particularly, the side light shielding patterns LSP1 to LSP5 are located on the side surfaces of the first transistor T1 and the second transistor T2, thereby preventing (or at least mitigating) the above-described sensor light from entering the semiconductor layer of the first and second transistors T1 and T2.

FIGS. 7 to 16 show an example arrangement of the side light shielding patterns LSP1 to LSP5. The arrangements of the side light shielding patterns may be modified variously as described below.

The transistors T1 to T7 include a conductive layer forming an electrode, a semiconductor layer forming a channel, and an insulating layer. The storage capacitor Cst includes conductive layers forming an electrode and an insulating layer located between the conductive layers. The organic light emitting diode OLED includes conductive layers forming an anode electrode and a cathode electrode, and an organic light emitting layer located therebetween. The electrical connection of the respective elements can be made by a wiring made of a conductive layer and/or a via made of a conductive material. The conductive material, the conductive layer, the semiconductor layer, the insulating layer, the organic light emitting layer, and the like are located on the substrate 710.

The pixel may include a substrate 710, a buffer layer 720, a lower light shielding layer BLSL, a semiconductor layer ACT, a first insulating layer 730, a first conductive layer 310, a second insulating layer 740, a second conductive layer 320, a third insulating layer 750, a third conductive layer 330, a via layer 760 and a third conductive layer 350, which are sequentially arranged. Each of the layers described above may consist of a single layer, or a stack of multiple layers. Other layers may be further located between the layers.

The substrate 710 supports the respective layers located thereon. A transparent substrate may be used when the organic light emitting display device is a back emission type or a both-sided emission type. When the organic light emitting display device is a front emission type, in addition to a transparent substrate, a translucent or opaque substrate may be applied.

The substrate 710 may be formed of an insulating material such as glass, quartz, or a polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 710 may include a metal material.

The substrate 710 may be a rigid substrate or a flexible substrate which can be bent, folded or rolled. An example of the material of the flexible substrate may be polyimide (PI), but is not limited thereto.

The buffer layer 720 may be located on the entire surface of the substrate 710. The buffer layer 720 can prevent diffusion of impurity ions, prevent penetration of moisture or external air, and perform a surface planarization function. The buffer layer 720 may include silicon nitride, silicon oxide, silicon oxynitride, or the like. The buffer layer 720 may be omitted depending on the type of the substrate 710, process conditions, and the like.

The lower light shielding layer BLSL may be located between the buffer layer 720 and the semiconductor layer ACT. The lower light shielding layer BLSL may be positioned partially on the substrate 710, instead of being positioned on the entire surface of the substrate 710. As described above, the lower light shielding layer BLSL may be arranged to overlap the sensor hole SH of the lower panel sheet 400.

The lower light shielding layer BLSL may be arranged to substantially overlap the semiconductor layer ACT in the thickness direction, the semiconductor layer ACT being arranged thereabove and arranged to overlap the sensor hole SH in the thickness direction. That is, the lower light shielding layer BLSL may have substantially the same planar shape as the semiconductor layer ACT arranged thereabove and arranged to overlap the sensor hole SH in the thickness direction. In this case, a manufacturing process of the lower light shielding layer BLSL may be performed using a mask of the same pattern as the semiconductor layer ACT arranged to overlap the sensor hole SH in the thickness direction.

According to some example embodiments, without being limited thereto, the lower light shielding layer BLSL may have a planar size larger than the planar size of the semiconductor layer ACT arranged to overlap the sensor hole SH, which is arranged thereabove, in the thickness direction. That is, the lower light shielding layer BLSL may be arranged to cover the semiconductor layer ACT in the thickness direction, the semiconductor layer ACT being arranged to overlap the sensor hole SH in the thickness direction, and extend further outward.

The lower light shielding layer BLSL is arranged to overlap the sensor hole SH and also arranged to overlap the semiconductor layer ACT of the pixel arranged to overlap the sensor hole SH. Accordingly, it is possible to prevent the light emitted from the optical transmitter 820 of the optical sensor 810 from entering the semiconductor layer ACT.

The lower light shielding layer BLSL may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The lower light shielding layer BLSL may be a single layer or a multilayer. For example, the lower light shielding layer BLSL may have a stacked structure of Ti/Al/Ti, Mo/Al/Mo, Mo/AlGe/Mo, or Ti/Cu.

The semiconductor layer ACT may be located on the lower light shielding layer BLSL. The semiconductor layer ACT may form the channel of the transistors T1 to T7. The semiconductor layer ACT may be separated for each pixel. The semiconductor layer ACT may have a specific pattern in a plan view. According to some example embodiments, the semiconductor layer ACT may be formed integrally. According to some example embodiments, the semiconductor layer ACT may be formed as a plurality of layers, but embodiments according to the present disclosure are not limited thereto. The semiconductor layer ACT may include a first semiconductor layer ACT1 which is a channel of the first transistor T1, a second semiconductor layer ACT2 which is a channel of the second transistor T2, a third semiconductor layer ACT3 which is a channel of the third transistor T3, a fourth semiconductor layer ACT4 which is a channel of the fourth transistor T4, a fifth semiconductor layer ACT5 which is a channel of the fifth transistor T5, a sixth semiconductor layer ACT6 which is a channel of the sixth transistor T6, and a seventh semiconductor layer ACT7 which is a channel of the seventh transistor T7.

As shown in FIG. 7, the semiconductor layers ACT1 to ACT7 may include a first vertical portion and a second vertical portion extending substantially in the column direction, a horizontal portion extending substantially in the row direction, and a bent portion extending in the column direction from the second vertical portion. The first vertical portion, the second vertical portion, the horizontal portion and the bent portion may be physically connected.

The first vertical portion may be located adjacent to the left side of the pixel, and the second vertical portion may be located adjacent to the right side of the pixel. The first vertical portion and the second vertical portion may be spaced apart from each other. The horizontal portion may connect intermediate portions of the first vertical portion and the second vertical portion. As used herein, the term "upper portion" of the first vertical portion and the second vertical portion may refer to a portion located above the connection portion with the horizontal portion in a plan view, and the term "lower portion" thereof may refer to a portion located below the connection portion with the horizontal portion in a plan view. The semiconductor layer ACT may have an approximate H shape in a plan view.

The second semiconductor layer ACT2 may be located on the upper portion of the first vertical portion, and the fifth semiconductor layer ACT5 may be located on the lower portion of the first vertical portion. The sixth semiconductor layer ACT6 may be located over the upper portion and the lower portion of the second vertical portion. The fourth semiconductor layer ACT4 may be located on the lower portion of the sixth semiconductor layer ACT6. The first semiconductor layer ACT1 may be located on the horizontal portion.

The bent portion of the semiconductor layer ACT may include a first sub-horizontal portion formed along the row direction on the left side, a first sub-vertical portion formed from the first sub-horizontal portion along the column direction on the upper side, a second sub-horizontal portion formed from the first sub-vertical portion along the row direction on the right side, and a second sub-vertical portion formed from the second sub-horizontal portion along the column direction on the lower side. The seventh semiconductor layer ACT7 may be located on the first sub-horizontal portion, and the third semiconductor layer ACT3 may be located on the first sub-vertical portion, the second sub-horizontal portion and the second sub-vertical portion.

The semiconductor layer ACT may include polycrystalline silicon. The polycrystalline silicon can be formed by crystallizing amorphous silicon. Examples of the crystallizing method may include rapid thermal annealing (RTA), solid phase crystallization (SPC), excimer laser annealing (ELA), metal-induced crystallization (MIC), metal-induced lateral crystallization (MILC), and sequential lateral solidification (SLS). As another example, the semiconductor layer ACT may include monocrystalline silicon, low temperature polycrystalline silicon, amorphous silicon, or the like.

Impurity ions (p-type impurity ions in the case of a PMOS transistor) may be doped in a region (source/drain region) connected to the source/drain electrode of each of the transistors T1 to T7 in the semiconductor layer ACT. A trivalent dopant such as boron (B) may be used as the p-type impurity ions.

According to some example embodiments, the semiconductor layer ACT may be an oxide semiconductor. When the semiconductor layer (ACT) is formed of an oxide semiconductor, an indium gallium zinc oxide (IGZO), a zinc tin oxide (ZTO), an indium tin oxide (IZO) may be used.

The first insulating layer 730 may be arranged on the semiconductor layer ACT and may be arranged substantially over the entire surface of the substrate 710. The first insulating layer 730 may be a gate insulating layer having a gate insulating function. The first insulating layer 730 may include a silicon compound, a metal oxide, or the like. For example, the first insulating layer 730 may include silicon oxide, silicon nitride, silicon oxynitride, aluminum oxide, tantalum oxide, hafnium oxide, zirconium oxide, titanium oxide, or the like. These may be used alone or in combination with each other. The first insulating layer 730 may be a single layer or a multilayer stack of different materials.

The first conductive layer 310 is arranged on the first insulating layer 730. The first conductive layer 310 may include a first scan line 311 for transmitting the first scan signal Gw-n (see FIG. 2), a second scan line 313 for transferring the second scan signal Gw-p (see FIG. 2), a third scan line 315 for transferring the third scan signal GI (see FIG. 2), an emission control line 317 for transmitting the emission control signal EM (see FIG. 2), and a gate electrode 319 of the first transistor T1.

The first scan line 311 may include the gate electrode of the third transistor T3, and the second scan line 313 may include the gate electrode of the second transistor T2 and the gate electrode of the seventh transistor T7. The third scan line 315 may include the gate electrode of the fourth transistor T4, and the emission control line 317 may include the gate electrode of the fifth transistor T5 and the gate electrode of the sixth transistor T6.

The first scan line 311, the second scan line 313, the third scan line 315 and the emission control line 317 may extend along the row direction. Each of the first scan line 311, the second scan line 313, the third scan line 315 and the emission control line 317 may extend to the adjacent pixel beyond the pixel boundary along the row direction.

The first scan line 311 may be located above the pixel. The first scan line 311 may overlap the third semiconductor layer ACT3 to form the gate electrodes of the third transistor T3 in the overlap region. With respect to the overlap region, the third semiconductor layer ACT3 located in the row direction on the right side may serve as a second electrode region of the third transistor T3, and the third semiconductor layer ACT3 located in the column direction on the lower side may serve as a first electrode region of the third transistor T3.

The second scan line 313 may be located in the column direction on the lower side of the first scan line 311. The second scan line 313 may overlap the second semiconductor layer ACT2 to form the gate electrode of the second transistor T2 in the overlap region. With respect to the overlap region, the second semiconductor layer ACT2 located in the column direction on the upper side may serve as a first electrode region of the second transistor T2, and the second semiconductor layer ACT2 located in the column direction on the lower side may serve as a second electrode region of the second transistor T2.

Further, the second scan line 313 may have a branch region protruding in the column direction on the upper side from a region in the row direction on the right side of the gate electrode of the second transistor T2. The branch region of the second scan line 313 may overlap the seventh semiconductor layer ACT7 to form the gate electrode of the seventh transistor T7 in the overlap region. With respect to the overlap region, the second vertical portion of the semiconductor layer ACT located in the column direction on the right side may serve as a first electrode region of the seventh transistor T7, and the seventh semiconductor layer ACT7 located in the row direction on the left side may serve as a second electrode region of the seventh transistor T7.

The third scan line 315 may be located in the column direction on the lower side of the second scan line 313. The third scan line 315 may overlap the fourth semiconductor layer ACT4 to form the gate electrode of the fourth transistor T4 in the overlap region. With respect to the overlap region, the fourth semiconductor layer ACT4 located in the column direction on the upper side may serve as a second electrode region of the fourth transistor T4, and the fourth semiconductor layer ACT4 located in the column direction on the lower side may serve as a first electrode region of the fourth transistor T4.

The emission control line 317 may be arranged between the second scan line 313 and the third scan line 315 in a plan view and may overlap the fifth semiconductor layer ACT5 to form the gate electrode of the fifth transistor T5 in the overlap region. With respect to the overlap region, the fifth semiconductor layer ACT5 located in the column direction on the lower side may serve as a first electrode region of the fifth transistor T5, and the fifth semiconductor layer ACT5 located in the column direction on the upper side may serve as a second electrode region of the fifth transistor T5.

Further, the emission control line 317 may overlap the sixth semiconductor layer ACT6 to form the gate electrode of the sixth transistor T6 in the overlap region. With respect to the overlap region, the sixth semiconductor layer ACT6 located in the column direction on the upper side may serve as a first electrode region of the sixth transistor T6, and the sixth semiconductor layer ACT6 located in the column direction on the lower side may serve as a second electrode region of the sixth transistor T6.

The gate electrode 319 of the first transistor T1 may be located at the center of the pixel. The gate electrode 319 of the first transistor T1 may be located between the second scan line 313 and the emission control line 317 in a plan view. The gate electrode 240 of the first transistor T1 may be separated for each pixel.

The gate electrode 319 of the first transistor T1 overlaps the first semiconductor layer ACT1. With respect to the overlap region, the first semiconductor layer ACT1 located in the row direction on the left side may serve as a first electrode region of the first transistor T1, and the first semiconductor layer ACT1 located in the row direction on the right side may serve as a second electrode region of the first transistor T1.

The first conductive layer 310 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 310 may be a single layer or a multilayer.

The second insulating layer 740 serves to insulate the first conductive layer 310 from the second conductive layer 320. The second insulating layer 740 may be arranged on the first conductive layer 310 and may be arranged substantially over the entire surface of the substrate 710. The second insulating layer 740 may be an interlayer insulating layer.

The second insulating layer 740 may be formed of an inorganic insulating material such as silicon oxide, silicon nitride, silicon oxynitride, hafnium oxide, aluminum oxide, titanium oxide, tantalum oxide and zinc oxide, or an organic insulating material such as acrylic resin, epoxy resin, phenolic resin, polyamide resin, polyimide resin, unsaturated polyester resin, polyphenylene resin, polyphenylenesulfide resin and benzocyclobutene (BCB). The second insulating layer 740 may be a single layer or a multilayer stack of different materials.

The second conductive layer 320 is arranged on the second insulating layer 740. The second conductive layer 320 may include an initialization voltage line 321 for supplying the initialization voltage VINT (see FIG. 2), a voltage mesh electrode 323 and a storage capacitor electrode line 325.

Each of the initialization voltage line 321, the voltage mesh electrode 323 and the storage capacitor electrode line 325 may extend along the row direction. Each of the initialization voltage line 321 and the storage capacitor electrode line 325 may extend to the adjacent pixel beyond the pixel boundary along the row direction.

The initialization voltage line 321 may be located on the upper side of the pixel in a plan view. The initialization voltage line 321 may be arranged to overlap at least a part of the third semiconductor layer ACT3 and the fourth semiconductor layer ACT4, but embodiments according to the present disclosure are not limited thereto.

The voltage mesh electrode 323 may be arranged to overlap the first sub-vertical portion and the first sub-horizontal portion of the bent portion of the semiconductor layer ACT.

The storage capacitor electrode line 325 may be located between the second scan line 313 and the emission control line 317 in a plan view across the center of the pixel. The storage capacitor electrode line 325 may be arranged to overlap the gate electrode 319 of the first transistor T1 arranged therebelow while the second insulating layer 740 is interposed therebetween to form the storage capacitor Cst. The gate electrode 319 of the first transistor T1 may serve as the first electrode of the storage capacitor Cst. The extended region of the storage capacitor electrode line 325 overlapped therewith may serve as the second electrode of the storage capacitor Cst. The second insulating layer 740 interposed therebetween may be a dielectric of the storage capacitor.

The width of the storage capacitor electrode line 325 may be extended in a region overlapping the gate electrode 319 of the first transistor T1. The storage capacitor electrode line 325 may include an opening overlapping the gate electrode 319 of the first transistor T1 arranged therebelow in the extended region.

The second conductive layer 320 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The third insulating layer 750 covers the second conductive layer 320. The third insulating layer 750 may be arranged substantially over the entire surface of the substrate 710. The third insulating layer 750 may be a gate insulating layer having a gate insulating function. The third insulating layer 750 may include the same material as the first insulating layer 730 or may include one or more materials selected from the example materials as the constituent materials of the first insulating layer 730. The third insulating layer 750 may be a single layer or a multilayer stack of different materials.

The third conductive layer 330 may include a data line 331 for transmitting the data signal DATA (see FIG. 2), a first source voltage supply line 333, and a plurality of data patterns 335, 337 and 339.

The data line 331 may extend along the column direction. The data line 331 may extend to the adjacent pixel beyond the pixel boundary along the column direction. The data line 331 may be arranged adjacent to the left side of the pixel. The data line 331 may be arranged to overlap at least a part of the second semiconductor layer ACT2.

The data line 331 may pass through the third insulating layer 750, the second insulating layer 740 and the first insulating layer 730 to be in contact with the first electrode region of the second semiconductor layer ACT2 through a first contact hole CNT1 exposing the first electrode region of the second semiconductor layer ACT2. The first contact hole CNT1 may be located on the lower side of the first scan line 311 in a plan view, but embodiments according to the present disclosure are not limited thereto.

The first side light shielding pattern LSP1 may be arranged between the first contact hole CNT1 and the data mesh electrode 323 in a plan view. The first side light shielding pattern LSP1 may be formed such that the data line 331 passes through at least the third insulating layer 750. That is, the data line 331 may completely pass through the third insulating layer 750 and may be located on the surface of the second insulating layer 740.

The first contact hole CNT1 and the first side light shielding pattern LSP1 may be formed in the same process using a mask. However, the first contact hole CNT1 and the first side light shielding pattern LSP1 may be formed using a mask having different openings. For example, openings with a slit or halftone pattern may be arranged on the first side light shielding pattern LSP1, and openings with a full-tone pattern may be arranged on the first contact hole CNT1. Accordingly, the first contact hole CNT1 may be formed to pass through the first to third insulating layers 730, 740, and 750 by the openings of the full-tone pattern arranged on the first contact hole CNT1, while the first side light shielding pattern LSP1 may pass through the third insulating layer 750 and terminate at the surface of the second insulating layer 740 by the openings of the slit or halftone pattern arranged on the first side light shielding pattern LSP1.

Other contact holes and side light shielding patterns to be mentioned below may be formed through the above-described mask process.

According to some example embodiments, the first side light shielding pattern LSP1 of the data line 331 may be located inside the second insulating layer 740 by completely passing through the third insulating layer 750 and partially passing through the second insulating layer 740.

According to some example embodiments, the first side light shielding pattern LSP1 of the data line 331 may be located on the surface of the first insulating layer 730 by completely passing through the third insulating layer 750 and the second insulating layer 740, or may be located inside the first insulating layer 730 by partially passing through the first insulating layer 730.

The first side light shielding pattern SLP1 may be arranged on the planar side surface of the third semiconductor layer ACT3 overlapping the gate electrode of the third transistor T3 and the planar side surface of the fourth semiconductor layer ACT4 overlapping the gate electrode of the fourth transistor T4, thereby preventing the sensor light from entering the third semiconductor layer ACT3 and the fourth semiconductor layer ACT4.

The first source voltage supply line 333 may extend along the column direction. The first source voltage supply line 333 may extend to the adjacent pixel beyond the pixel boundary along the column direction. The first source voltage supply line 333 may be arranged adjacent to the right side of the data line 331 in the row direction. The first source voltage supply line 333 may extend along the column direction while overlapping at least a part of the third semiconductor layer ACT3, the second semiconductor layer ACT2, the first semiconductor layer ACT1 and the fifth semiconductor layer ACT5 from the upper side.

The first source voltage supply line 333 may pass through the third insulating layer 750 to be in contact with the data mesh electrode 323 through second and third contact holes CNT2 and CNT3 exposing the data mesh electrode 323. The width of the second and third contact holes CNT2 and CNT3 in the row direction may be larger than the width of the first sub-vertical portion of the bent portion of the semiconductor layer ACT in the row direction, but embodiments according to the present disclosure are not limited thereto. The pixel 10 according to some example embodiments has two or more contact holes connecting the first source voltage supply line 333 and the voltage mesh electrode 323, thereby mitigating the sensor light entering the semiconductor layers ACT3 and ACT4 of the third and fourth transistors T3 and T4.

Further, the first source voltage supply line 333 may pass through the third insulating layer 750 to be in contact with the storage capacitor electrode line 325 through fourth and fifth contact holes CNT4 and CNT5 exposing the storage capacitor electrode line 325.

The pixel 10 according to some example embodiments has two or more contact holes connecting the first source voltage supply line 333 and the storage capacitor electrode line 325, thereby mitigating the sensor light entering the semiconductor layers ACT3 and ACT4 of the third and fourth transistors T3 and T4.

Further, the first source voltage supply line 333 may pass through the first to third insulating layers 730, 740 and 750 to be in contact with the first electrode region of the fifth semiconductor layer ACT5 through a sixth contact hole CNT6 exposing the first electrode region of the fifth semiconductor layer ACT5.

The second side light shielding pattern LSP2 may be arranged on the right side of the sixth contact hole CNT6 in a plan view. The second side light shielding pattern LSP2 may be formed such that the first source voltage supply line 333 passes through at least the third insulating layer 750. That is, the first source voltage supply line 333 may completely pass through the third insulating layer 750 and may be located on the surface of the second insulating layer 740.

According to some example embodiments, the second side light shielding pattern LSP2 of the first source voltage supply line 333 may be located inside the second insulating layer 740 by completely passing through the third insulating layer 750 and partially passing through the second insulating layer 740.

According to some example embodiments, the second side light shielding pattern LSP2 of the first source voltage supply line 333 may be located on the surface of the first insulating layer 730 by completely passing through the third insulating layer 750 and the second insulating layer 740, or may be located inside the first insulating layer 730 by partially passing through the first insulating layer 730.

The second side light shielding pattern LSP2 may be arranged on the planar side surface of the third semiconductor layer ACT3 overlapping the gate electrode of the third transistor T3 and the planar side surface of the fourth semiconductor layer ACT4 overlapping the gate electrode of the fourth transistor T4, thereby preventing the sensor light from entering the third semiconductor layer ACT3 and the fourth semiconductor layer ACT4.

Further, the fifth side light shielding pattern LSP5 may be arranged between the sixth contact hole CNT6 and the fifth contact hole CNT5 in a plan view. The fifth side light shielding pattern LSP5 may be formed such that the first source voltage supply line 333 passes through at least the third insulating layer 750. That is, the first source voltage supply line 333 may completely pass through the third insulating layer 750 and may be located on the surface of the second insulating layer 740.

According to some example embodiments, the fifth side light shielding pattern LSP5 of the first source voltage supply line 333 may be located inside the second insulating layer 740 by completely passing through the third insulating layer 750 and partially passing through the second insulating layer 740.

According to some example embodiments, the fifth side light shielding pattern LSP5 of the first source voltage supply line 333 may be located on the surface of the first insulating layer 730 by completely passing through the third insulating layer 750 and the second insulating layer 740, or may be located inside the first insulating layer 730 by partially passing through the first insulating layer 730.

The fifth side light shielding pattern LSP5 may be arranged on the planar side surface of the third semiconductor layer ACT3 overlapping the gate electrode of the third transistor T3 and the planar side surface of the fourth semiconductor layer ACT4 overlapping the gate electrode of the fourth transistor T4, thereby preventing the sensor light from entering the third semiconductor layer ACT3 and the fourth semiconductor layer ACT4.

The plurality of data patterns may include a first data pattern 335, a second data pattern 337 and a third data pattern 339. The first and second data patterns 335 and 337 may have a shape extending substantially in the column direction, and the third data pattern 339 may have a shape extending in the row direction, but embodiments according to the present disclosure are not limited thereto.

The first data pattern 335 may overlap the gate electrode 319 of the first transistor T1 and the second electrode region of the seventh semiconductor layer ACT7. The first data pattern 335 may pass through the third insulating layer 750 and the second insulating layer 740 in a region overlapping the gate electrode 319 of the first transistor T1 to be electrically connected to the gate electrode 319 of the first transistor T1 through an eighth contact hole CNT8 exposing the gate electrode 319. The eighth contact hole CNT8 may be located in the opening of the storage capacitor electrode line 325. The first data pattern 335 in the eighth contact hole CNT8 and the storage capacitor electrode line 325 adjacent thereto may be insulated from each other via the third insulating layer 750.

Further, the first data pattern 335 may pass through the third insulating layer 750, the second insulating layer 740 and the first insulating layer 730 in a region overlapping the second electrode region of the seventh semiconductor layer ACT7 to be in contact with the second electrode region of the seventh semiconductor layer ACT7 through a seventh contact hole CNT7 exposing the second electrode region of the seventh semiconductor layer ACT7. That is, the first data pattern 335 may connect the second electrode region of the seventh semiconductor layer ACT7 to the gate electrode 319 of the first transistor T1.

The third side light shielding pattern LSP3 may be arranged on the right side of the seventh contact hole CNT7 in a plan view. The third side light shielding pattern LSP3 may be formed such that the first data pattern 335 passes through at least the third insulating layer 750. That is, the first data pattern 335 may completely pass through the third insulating layer 750 and may be located on the surface of the second insulating layer 740.

According to some example embodiments, the third side light shielding pattern LSP3 of the first data pattern 335 may be located inside the second insulating layer 740 by completely passing through the third insulating layer 750 and partially passing through the second insulating layer 740.

According to some example embodiments, the third side light shielding pattern LSP3 of the first data pattern 335 may be located on the surface of the first insulating layer 730 by completely passing through the third insulating layer 750 and the second insulating layer 740, or may be located inside the first insulating layer 730 by partially passing through the first insulating layer 730.

The third side light shielding pattern LSP3 may be arranged on the planar side surface of the third semiconductor layer ACT3 overlapping the gate electrode of the third transistor T3 and the planar side surface of the fourth semiconductor layer ACT4 overlapping the gate electrode of the fourth transistor T4, thereby preventing the sensor light from entering the third semiconductor layer ACT3 and the fourth semiconductor layer ACT4.

The second data pattern 337 may overlap the second electrode region of the third semiconductor layer ACT3 and an initialization voltage line 230. The second data pattern 337 may pass through the third insulating layer 750, the second insulating layer 740 and the first insulating layer 730 in a region overlapping the second electrode region of the third semiconductor layer ACT3 to be in contact with the second electrode region of the third semiconductor layer ACT3 through a tenth contact hole CNT10 exposing the second electrode region of the third semiconductor layer ACT3.

Further, the second data pattern 337 may pass through the third insulating layer 750 in a region overlapping the initialization voltage line 230 to be in contact with the initialization voltage line 230 through a ninth contact hole CNT9 exposing the initialization voltage line 230.

The fourth side light shielding pattern LSP4 may be arranged on the right side of the tenth contact hole CNT10 in a plan view. The fourth side light shielding pattern LSP4 may be formed such that the second data pattern 337 passes through at least the third insulating layer 750. That is, the second data pattern 337 may completely pass through the third insulating layer 750 and may be located on the surface of the second insulating layer 740.

According to some example embodiments, the fourth side light shielding pattern LSP4 of the second data pattern 337 may be located inside the second insulating layer 740 by completely passing through the third insulating layer 750 and partially passing through the second insulating layer 740.

According to some example embodiments, the fourth side light shielding pattern LSP4 of the second data pattern 337 may be located on the surface of the first insulating layer 730 by completely passing through the third insulating layer 750 and the second insulating layer 740, or may be located inside the first insulating layer 730 by partially passing through the first insulating layer 730.

The fourth side light shielding pattern LSP4 may be arranged on the planar side surface of the third semiconductor layer ACT3 overlapping the gate electrode of the third transistor T3 and the planar side surface of the fourth semiconductor layer ACT4 overlapping the gate electrode of the fourth transistor T4, thereby preventing the sensor light from entering the third semiconductor layer ACT3 and the fourth semiconductor layer ACT4.

The third data pattern 339 may overlap the second electrode region of the sixth semiconductor layer ACT6. The third data pattern 339 may pass through the third insulating layer 750, the second insulating layer 740 and the first insulating layer 730 in a region overlapping the second electrode region of the sixth semiconductor layer ACT6 to be in contact with the second electrode region of the sixth semiconductor layer ACT6 through a twelfth contact hole CNT12 exposing the second electrode region of the sixth semiconductor layer ACT6.

The third conductive layer 330 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 330 may be a single layer or a multilayer. For example, the third conductive layer 330 may have a stacked structure of Ti/Al/Ti, Mo/Al/Mo, Mo/AlGe/Mo, or Ti/Cu.

The via layer 760 serves to insulate the third conductive layer 330 from the fourth conductive layer 350. The via layer 760 may be arranged on the third conductive layer 330 and may be arranged substantially over the entire surface of the substrate 710. The via layer 760 may be an interlayer insulating layer. The via layer 760 may include the same material as the second insulating layer 740 or may include one or more materials selected from the example materials as the constituent materials of the second insulating layer 740. The via layer 760 may be a single layer or a multilayer stack of different materials.

The fourth conductive layer 350 is arranged on the via layer 760. The fourth conductive layer 350 may include an anode electrode of the organic light emitting diode OLED. The anode electrode may pass through the via layer 760 to be in contact with the third data pattern 339 through an eleventh contact hole CNT11 exposing the third data pattern 339.

Figure 17:
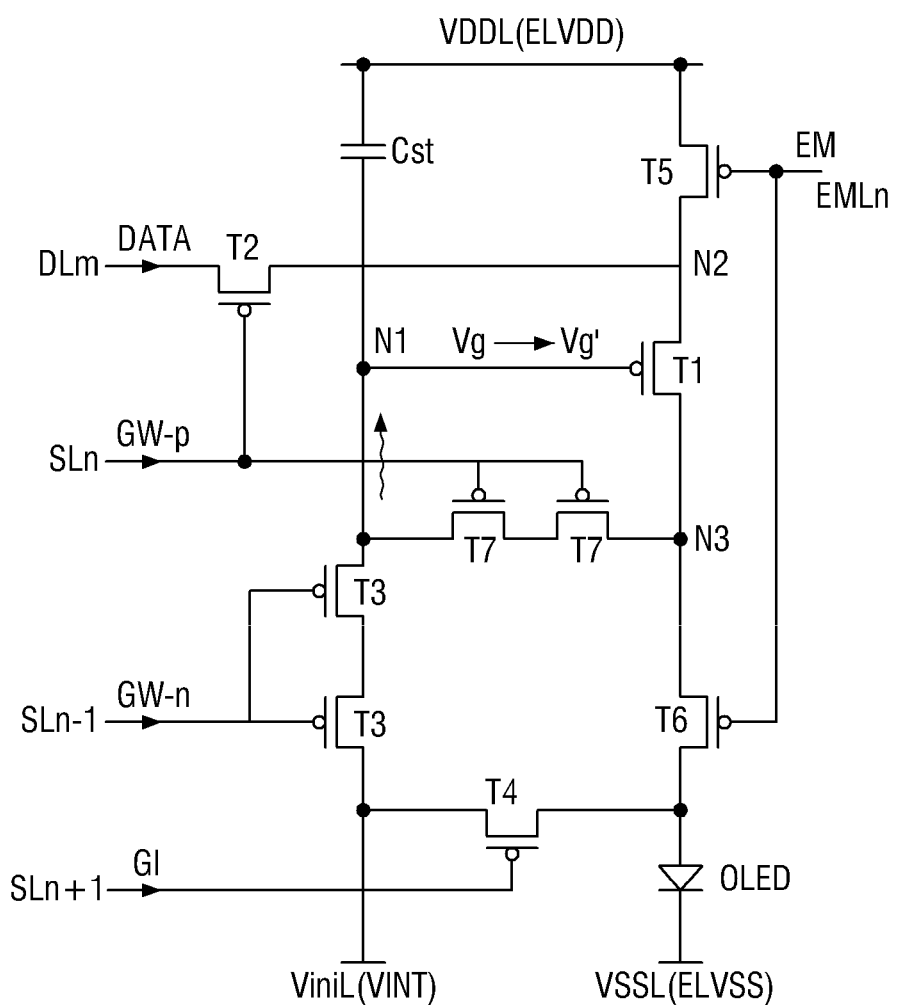
FIG. 17 is an equivalent circuit diagram of one pixel showing a case where a leakage current occurs in a third transistor T3.
Figure 18:
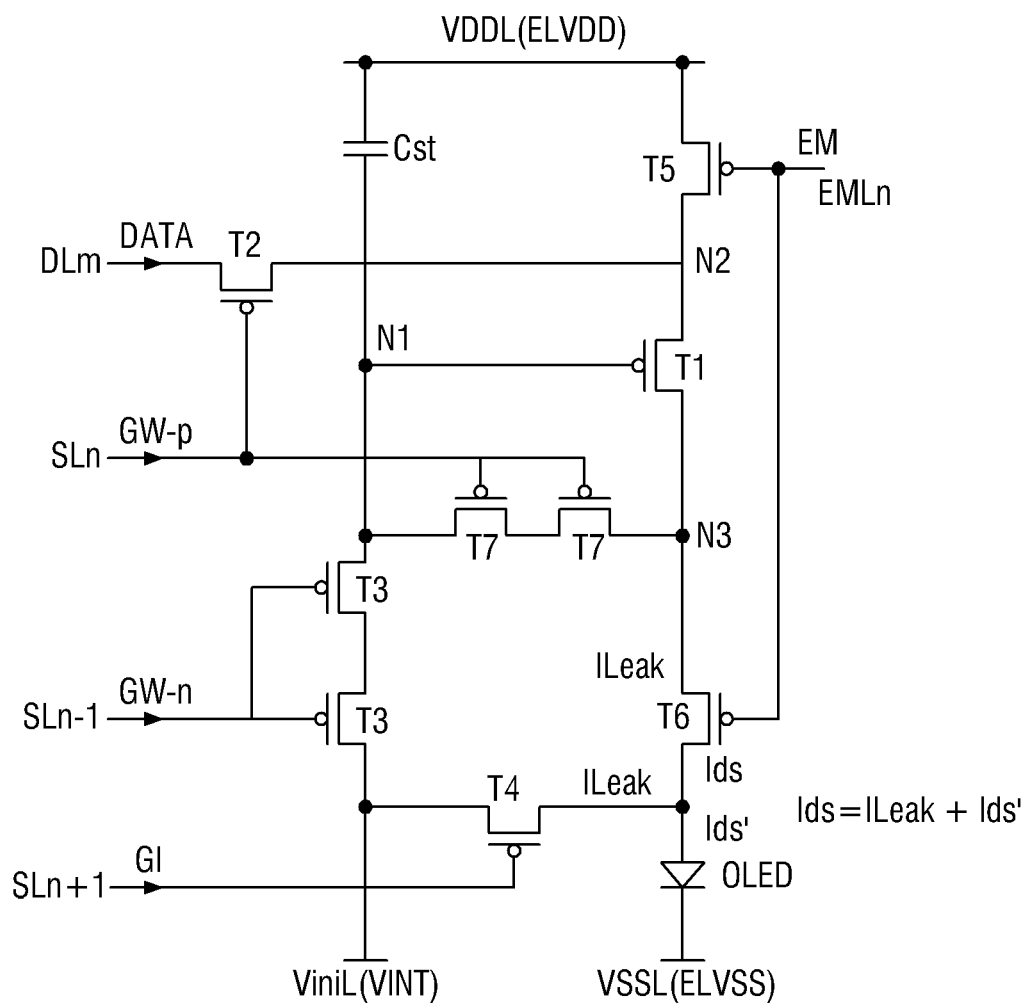
FIG. 18 is an equivalent circuit diagram of one pixel showing a case where a leakage current occurs in a fourth transistor T4.

FIG. 17 is an equivalent circuit diagram of one pixel showing a case where a leakage current occurs in the third transistor T3. FIG. 18 is an equivalent circuit diagram of one pixel showing a case where a leakage current occurs in the fourth transistor T4.

First, referring to FIG. 17, when the driving current Ids flows through the first transistor T1 by the emission control signal EM of the pixel of the display device 1, if the leakage current (off current) occurs in the third transistor T3 as described above, the initialization voltage VINT may be applied to the gate electrode of the first transistor T1 and the gate voltage of the first transistor T1 may be lowered. For example, the gate voltage of the first transistor T1 may have a modified gate voltage Vg' lower than a reference gate voltage Vg of the first transistor T1. Accordingly, the driving current passing through the first transistor T1 may increase and the gradation of the first transistor T1 may increase.

As another example, referring to FIG. 18, when the driving current Ids flows through the first transistor T1 by the emission control signal EM of the pixel of the display device 1, if a leakage current ILeak occurs in the fourth transistor T4 as described above, a driving current Ids' applied to the organic light emitting diode OLED may be lower than the reference driving current Ids. Accordingly, the gradation of the first transistor T1 may decrease.

However, the display panel 300 of the display device 1 according to some example embodiments may include, as described above, the light shielding pattern LSP including the lower light shielding layer BLSL and the plurality of side light shielding patterns LSP1 to LSP5 arranged on the side surfaces of the third and fourth transistors T3 and T4 of the pixel arranged to overlap the sensor hole SH in the thickness direction.

That is, the sensor light can be prevented from directly entering the lower portion of the semiconductor layer ACT by the lower light shielding layer BLSL arranged to overlap the lower portion of the semiconductor layer ACT arranged to overlap the sensor hole SH of the display panel 300 in the thickness direction. However, when it does not enter the lower light shielding layer BLSL or is reflected back to the lower portion by the lower light shielding layer BLSL, the sensor light may enter the semiconductor layer ACT through the planar side surface of the semiconductor layer ACT due to the lower structure.

In the display device 1 according to some example embodiments, the light shielding pattern LSP may be arranged on the planar side surfaces of the third semiconductor layer ACT3 overlapping the gate electrode of the third transistor T3 of the pixel arranged to overlap the sensor hole SH and the fourth semiconductor layer ACT4 overlapping the gate electrode of the fourth transistor T4 thereof, thereby preventing the sensor light from entering the third semiconductor layer ACT3 and the fourth semiconductor layer ACT4. Accordingly, it is possible to mitigate an increase in gradation of the first transistor T1 due to the leakage current generated in the third transistor T3 of each pixel arranged to overlap the sensor hole SH by the sensor light emitted from the optical sensor, or a decrease in gradation of the first transistor T1 due to the leakage current ILeak generated in the first transistor T4.

Hereinafter, a display device according to some example embodiments will be described. In the following embodiment, the same components as those described above are denoted by the same reference numerals, and a description thereof may be omitted or simplified.

Figure 19:
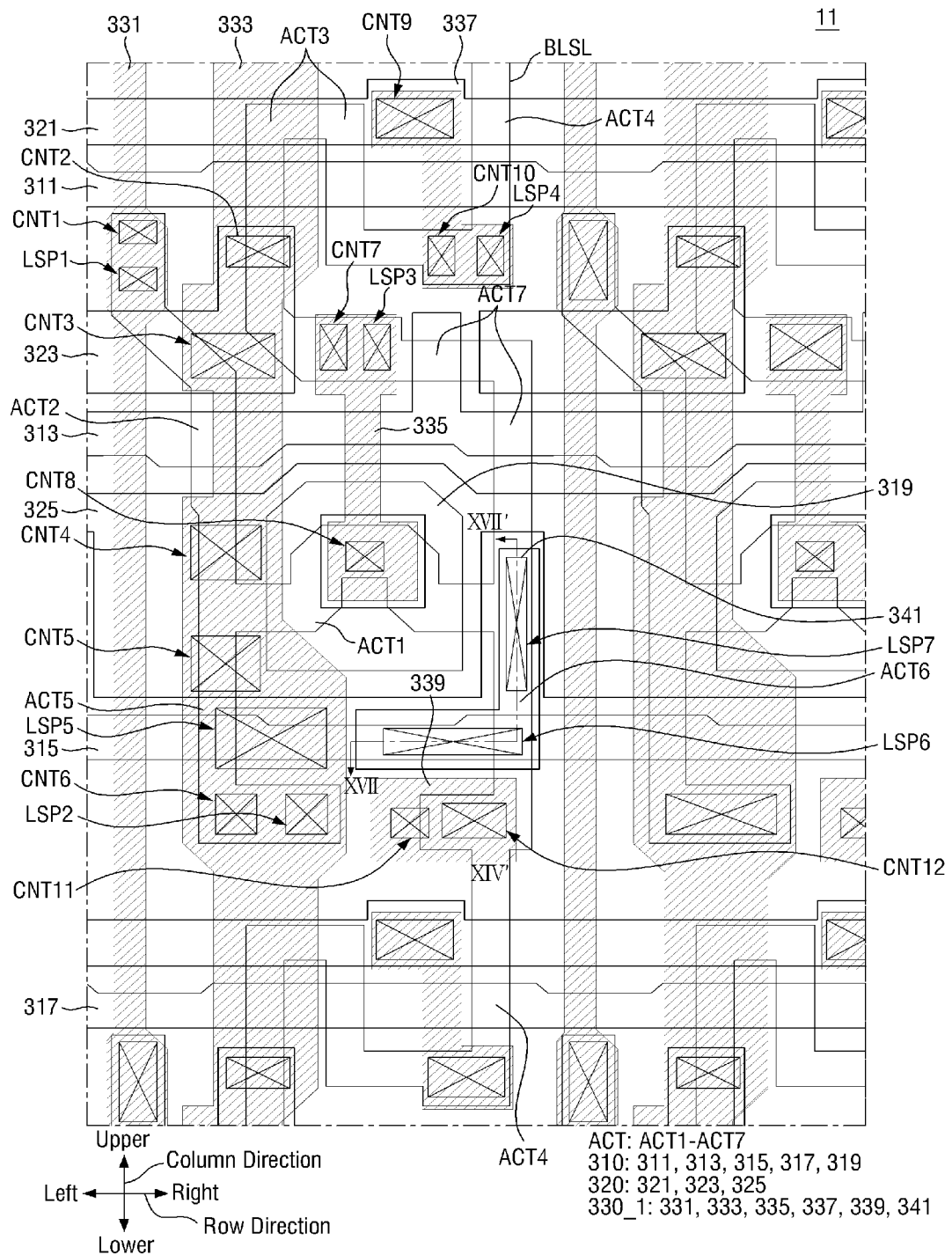
FIG. 19 is a layout diagram of one pixel of a display device according to some example embodiments.
Figure 20:
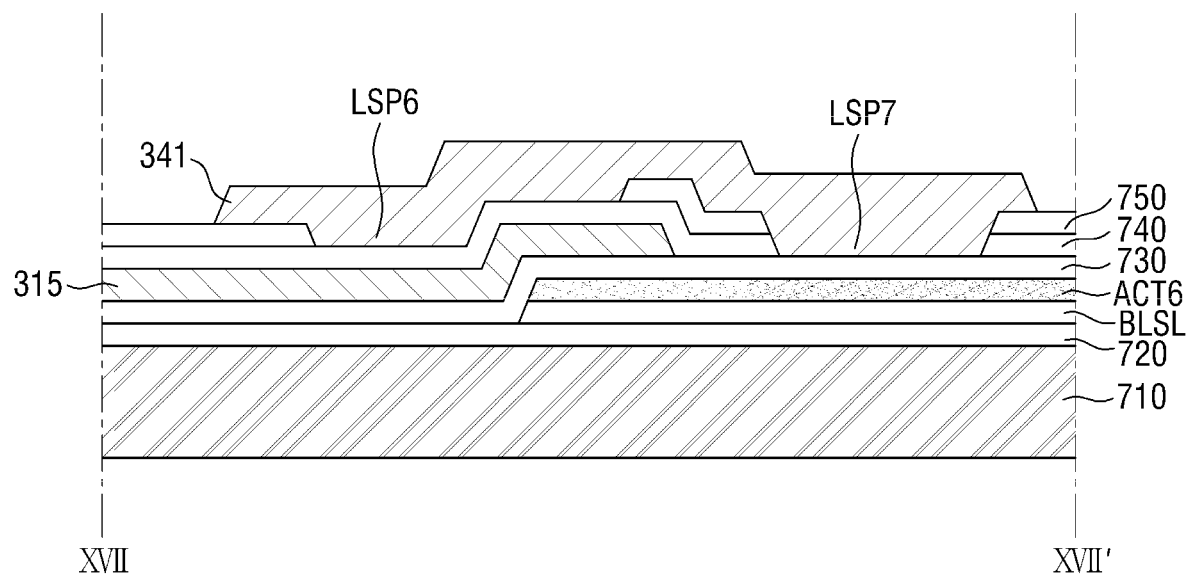
FIG. 20 is a cross-sectional view taken along the line XVII-XVII' of FIG. 19.

FIG. 19 is a layout diagram of one pixel of a display device according to some example embodiments. FIG. 20 is a cross-sectional view taken along the line XVII-XVII' of FIG. 19.

Referring to FIGS. 19 and 20, it is illustrated that a second conductive layer 330_1 has a different data pattern other than the above-described data pattern, and the side light shielding pattern can be formed using the different data pattern.

For example, the second conductive layer 330_1 according to some example embodiments may further include a fourth data pattern 341. The fourth data pattern 341 may be arranged between the first source voltage supply line 333 and the data line 331 of the adjacent pixel in a plan view, and may be arranged between the third data pattern 339 and the first data pattern 335.

The fourth data pattern 341 may include, for example, a fourth-first horizontal portion overlapping the third scan line 315 in the thickness direction and extending to the right side in the row direction, and a fourth-first vertical portion extending from the fourth-first horizontal portion to the upper side in the column direction.

A sixth side light shielding pattern LSP6 overlapping the fourth-first horizontal portion in the thickness direction and a seventh side light shielding pattern LSP7 overlapping the fourth-first vertical portion in the thickness direction may be arranged. The sixth side light shielding pattern LSP6 may be formed such that the fourth data pattern 341 passes through the third insulating layer 750. That is, the sixth side light shielding pattern LSP6 of the fourth data pattern 341 may completely pass through the third insulating layer 750 and may be located on the surface of the second insulating layer 740.

The seventh side light shielding pattern LSP7 may be formed such that the fourth data pattern 341 passes through at least the third insulating layer 750. That is, the seventh side light shielding pattern LSP7 of the fourth data pattern 341 may completely pass through the third insulating layer 750 and may be located on the surface of the second insulating layer 740.

According to some example embodiments, the seventh side light shielding pattern LSP7 of the fourth data pattern 341 may be located inside the second insulating layer 740 by completely passing through the third insulating layer 750 and partially passing through the second insulating layer 740.

According to some example embodiments, the seventh side light shielding pattern LSP7 of the fourth data pattern 341 may be located on the surface of the first insulating layer 730 by completely passing through the third insulating layer 750 and the second insulating layer 740, or may be located inside the first insulating layer 730 by partially passing through the first insulating layer 730.

The sixth and seventh side light shielding patterns LSP6 and LSP7 may be arranged on the planar side surfaces of the third semiconductor layer ACT3 overlapping the gate electrode of the third transistor T3 of the pixel arranged to overlap the sensor hole SH and the fourth semiconductor layer ACT4 overlapping the gate electrode of the fourth transistor T4 thereof, thereby preventing the sensor light from entering the third semiconductor layer ACT3 and the fourth semiconductor layer ACT4.

Figure 21:
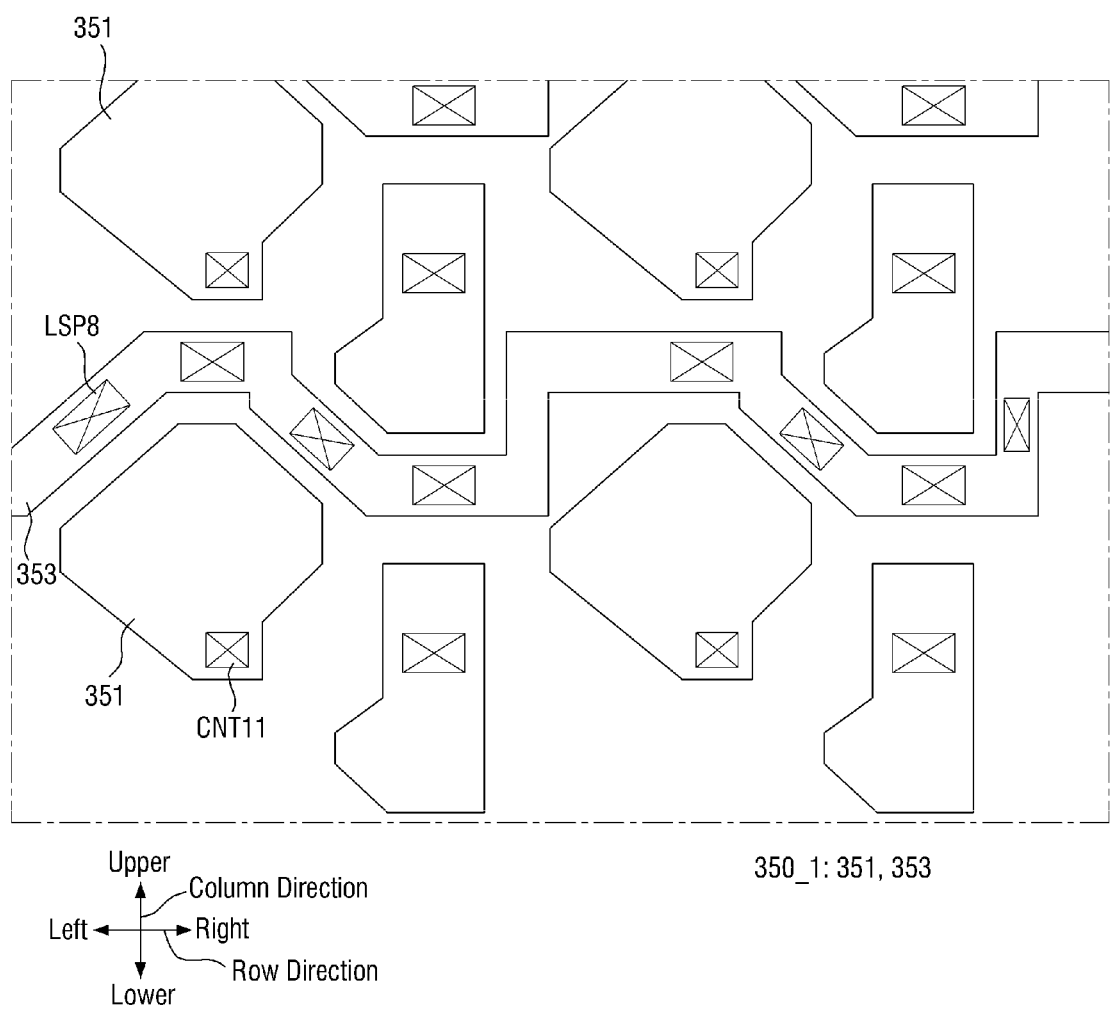
FIG. 21 is a layout diagram of pixels of a display device according to some example embodiments.
Figure 22:
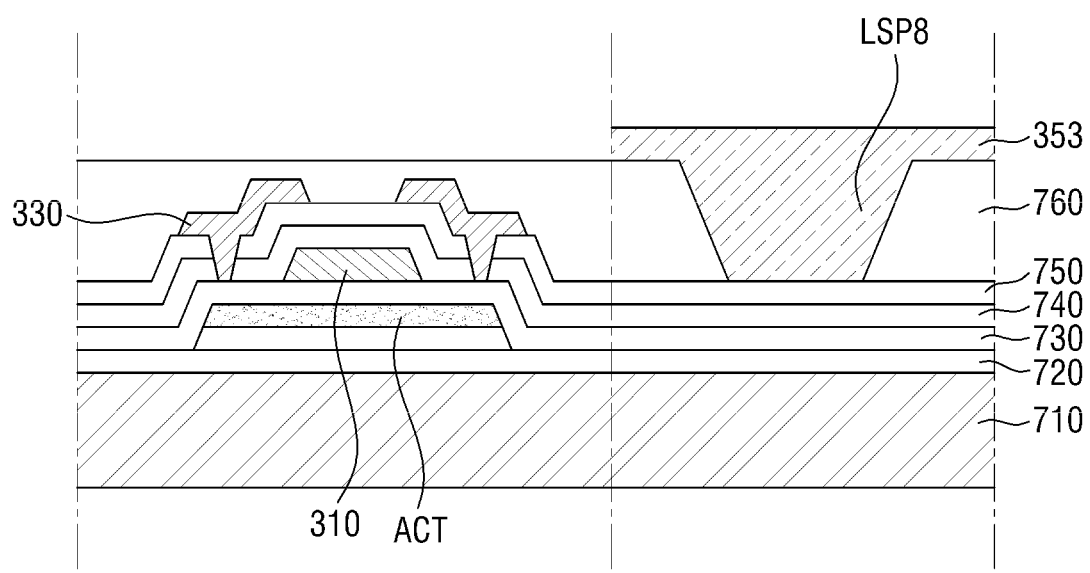
FIG. 22 is a schematic cross-sectional view of a transistor and a fourth conductive layer of FIG. 21.

FIG. 21 is a layout diagram of pixels of a display device according to some example embodiments. FIG. 22 is a schematic cross-sectional view of a transistor and a fourth conductive layer of FIG. 21.

Referring to FIGS. 21 and 22, the present embodiment is different from the embodiment of FIG. 6 in that a fourth conductive layer 350_1 further includes a via electrode 353 between anode electrodes 351 arranged along the column direction and it further includes an eighth side light shielding pattern LSP8.

For example, the fourth conductive layer 350_1 may further include the via electrode 353 between the anode electrodes 351 arranged along the column direction. The eighth side light shielding pattern LSP8 may be formed such that the via electrode 353 passes through the via layer 760.

The eighth side light shielding pattern LSP8 may be arranged on the planar side surfaces of the third semiconductor layer ACT3 overlapping the gate electrode of the third transistor T3 of the pixel arranged to overlap the sensor hole SH and the fourth semiconductor layer ACT4 overlapping the gate electrode of the fourth transistor T4 thereof, thereby preventing the sensor light from entering the third semiconductor layer ACT3 and the fourth semiconductor layer ACT4.

Figure 23:
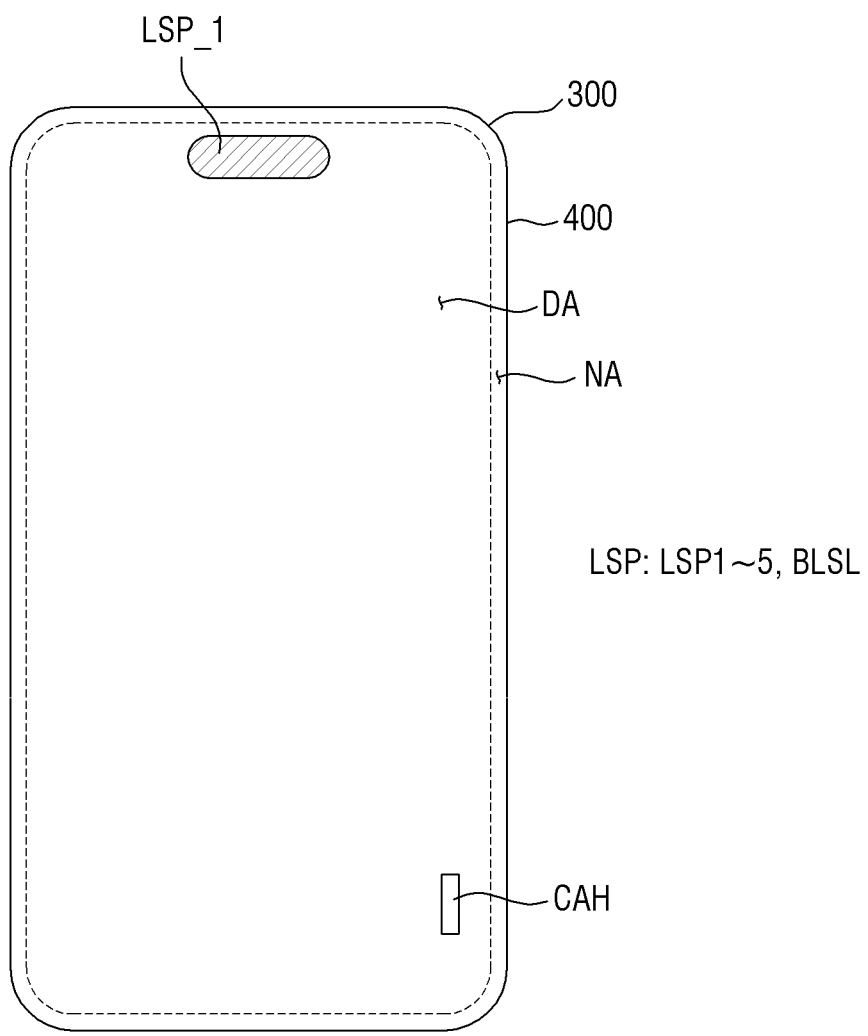
FIG. 23 is a schematic plan layout diagram of a lower panel sheet, a display panel, and a light shielding pattern of the display panel according to some example embodiments.

FIG. 23 is a schematic plan layout diagram of a lower panel sheet, a display panel, and a light shielding pattern of the display panel according to some example embodiments.

Referring to FIG. 23, a light shielding pattern LSP_1 according to the present embodiment is different from the light shielding pattern LSP of FIG. 4 in that the light shielding pattern LSP_1 is arranged to overlap the sensor hole SH of the lower panel sheet 400 and may be further extended to a peripheral region of the sensor hole SH in a plan view.

Other configurations have been described above with reference to FIGS. 4 and 6 and the like, and thus, a redundant description will be omitted.

Figure 24:
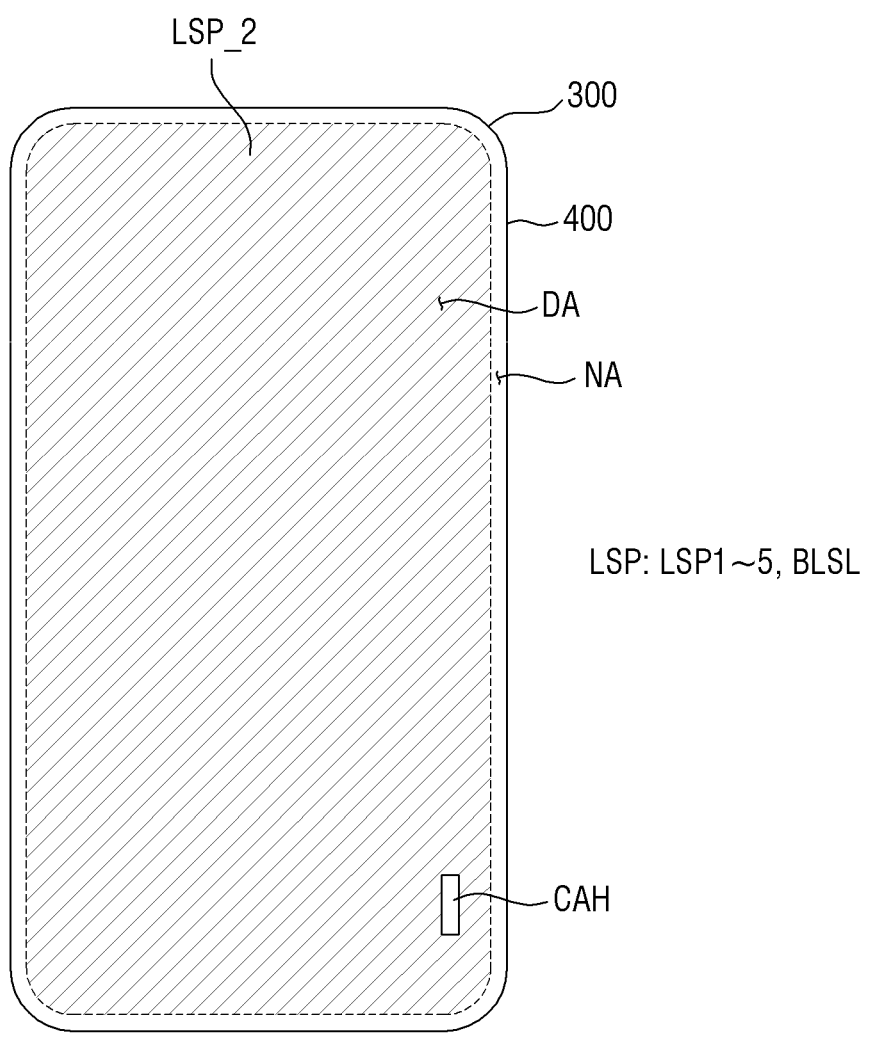
FIG. 24 is a schematic plan layout diagram of a lower panel sheet, a display panel, and a light shielding pattern of the display panel according to some example embodiments.

FIG. 24 is a schematic plan layout diagram of a lower panel sheet, a display panel, and a light shielding pattern of the display panel according to some example embodiments.

Referring to FIG. 24, a light shielding pattern LSP_2 according to the present embodiment is different from the light shielding pattern LSP of FIG. 4 in that the light shielding pattern LSP_2 is arranged to overlap the sensor hole SH of the lower panel sheet 400 and may be further extended to a peripheral region of the sensor hole SH in a plan view such that its planar size is equal to the planar size of the display area DA of the display panel.

Other configurations have been described above with reference to FIGS. 4 and 6 and the like, and thus, a redundant description will be omitted.

What is claimed is:

1. A display device comprising:
   a substrate;
   an active layer on the substrate, the active layer including a first active pattern including a source region, a drain region, and an active region between the source region and the drain region;
   a first insulating layer on the active layer;
   a first conductive layer on the first insulating layer and including a gate electrode;
   a second insulating layer on the first conductive layer;
   a second conductive layer on the second insulating layer;
   a third insulating layer on the second conductive layer; and
   a third conductive layer on the second insulating layer and including a source electrode connected to the source region of the first active pattern through a contact hole passing through the first insulating layer and the second insulating layer, and a drain electrode connected to the drain region of the first active pattern through a contact hole passing through the first insulating layer and the second insulating layer,
   wherein the first active pattern, the gate electrode, the source electrode and the drain electrode constitute a thin film transistor,
   the display device further comprising at least one light shielding pattern around the thin film transistor in a plan view, wherein the light shielding pattern includes a side light shielding pattern such that a constituent material of the third conductive layer passes through at least the third insulating layer in a thickness direction and wherein a whole area of a bottom surface of the side light shielding pattern contacts at least one of the first insulating layer, the second insulating layer and the third insulating layer.

2. The display device of claim 1, wherein the side light shielding pattern is formed such that the constituent material of the third conductive layer passes through the third insulating layer.

3. The display device of claim 2, wherein the side light shielding pattern further passes through the second insulating layer in a thickness direction.

4. The display device of claim 3, wherein the side light shielding pattern passes through a part of the first insulating layer to terminate inside the first insulating layer.

5. The display device of claim 1, wherein the side light shielding pattern is formed using a halftone or slit mask.

6. The display device of claim 1, wherein the thin film transistor is configured to be electrically connected to a driving transistor.

7. The display device of claim 1, wherein the light shielding pattern is provided plurally, the second conductive layer includes a first data pattern, and the plurality of light shielding patterns include a first light shielding pattern such that a constituent material of the first data pattern passes through the third insulating layer.

8. The display device of claim 1, further comprising:
a lower light shielding pattern between the substrate and the active layer,
wherein a planar size of the lower light shielding pattern is larger than a planar size of the active layer.

9. The display device of claim 8, wherein the active layer and the lower light shielding pattern are formed using the same mask.

10. The display device of claim 8, wherein the lower light shielding pattern completely covers the active layer.

11. The display device of claim 8, wherein a planar shape of the lower light shielding pattern is the same as a planar shape of the active layer.

12. The display device of claim 8, wherein the lower light shielding pattern includes a metal material.

13. The display device of claim 1, wherein the substrate includes a display area where a plurality of pixels including the thin film transistor are positioned, and a non-display area around the display area,
the display device further comprising:
a lower cover panel below the substrate, and an optical sensor surrounded by the lower cover panel in the plan view and below the display area of the substrate.

14. The display device of claim 13, wherein the display area includes an optical sensor arrangement region where the optical sensor is positioned and an optical sensor non-arrangement region where the optical sensor is not positioned, and
wherein the side light shielding pattern is on the optical sensor arrangement region and is not on the optical sensor non-arrangement region.

15. The display device of claim 13, wherein the display area includes an optical sensor arrangement region where the optical sensor is positioned and an optical sensor non-arrangement region where the optical sensor is not positioned, and
wherein the side light shielding pattern is over the optical sensor arrangement region and the optical sensor non-arrangement region.

16. A display device comprising:
a display panel;
a lower panel sheet below the display panel; and
an optical sensor below the display panel and within the lower panel sheet in a plan view,
wherein the display panel includes:
a display substrate;
an active layer on the display substrate, the active layer including a first active pattern including a source region, a drain region, and an active region between the source region and the drain region;
a first insulating layer on the active layer;
a first conductive layer on the first insulating layer and including a gate electrode;
a second insulating layer on the first conductive layer;
a second conductive layer on the second insulating layer;
a third insulating layer on the second conductive layer; and
a third conductive layer on the second insulating layer and including a source electrode connected to the source region of the first active pattern through a contact hole passing through the first insulating layer and the second insulating layer, and a drain electrode connected to the drain region of the first active pattern through a contact hole passing through the first insulating layer and the second insulating layer,
wherein the first active pattern, the gate electrode, the source electrode and the drain electrode constitute a first transistor electrically connected to a driving transistor,
the display device further comprising a plurality of light shielding patterns around the first transistor in a plan view,
wherein the light shielding patterns include a side light shielding pattern such that a constituent material of the third conductive layer passes through at least the third insulating layer in a thickness direction and
wherein a whole area of a bottom surface of the side light shielding pattern contacts at least one of the first insulating layer, the second insulating layer and the third insulating layer.

17. The display device of claim 16, wherein the side light shielding pattern is formed such that the constituent material of the third conductive layer passes through the third insulating layer.

18. The display device of claim 17, wherein the side light shielding pattern further passes through the second insulating layer in a thickness direction.

19. The display device of claim 18, wherein the side light shielding pattern passes through a part of the first insulating layer to terminate inside the first insulating layer.

20. The display device of claim 16, wherein the display area includes an optical sensor arrangement region where the optical sensor is positioned and an optical sensor non-arrangement region where the optical sensor is not positioned, and
wherein the side light shielding pattern is on the optical sensor arrangement region and is not on the optical sensor non-arrangement region.

* * * * *